United States Patent
Kong et al.

(10) Patent No.: US 9,093,535 B2
(45) Date of Patent: Jul. 28, 2015

(54) METHOD OF PLANARIZING SUBSTRATE AND METHOD OF MANUFACTURING THIN FILM TRANSISTOR USING THE SAME

(71) Applicant: Samsung Display Co., LTD., Yongin, Gyeonggi-Do (KR)

(72) Inventors: Hyang-Shik Kong, Seongnam-si (KR); Seung-Bo Shim, Asan-si (KR); Jin-Ho Ju, Seoul (KR); Jun-Gi Kim, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/677,172

(22) Filed: Nov. 14, 2012

(65) Prior Publication Data

US 2013/0210202 A1 Aug. 15, 2013

(30) Foreign Application Priority Data

Feb. 14, 2012 (KR) ........................ 10-2012-0014935

(51) Int. Cl.
| | | |
|---|---|---|
| *H01L 21/311* | (2006.01) | |
| *H01L 29/786* | (2006.01) | |
| *H01L 21/02* | (2006.01) | |
| *H01L 29/66* | (2006.01) | |
| *H01L 21/027* | (2006.01) | |
| *H01L 21/321* | (2006.01) | |

(52) U.S. Cl.
CPC .......... *H01L 29/786* (2013.01); *H01L 21/0274* (2013.01); *H01L 21/02697* (2013.01); *H01L 21/32115* (2013.01); *H01L 29/66765* (2013.01); *H01L 29/78603* (2013.01); *H01L 29/7869* (2013.01)

(58) Field of Classification Search
USPC .................................. 438/692, 691, 694, 585
See application file for complete search history.

(56) References Cited

U.S. PATENT DOCUMENTS

| | | | | |
|---|---|---|---|---|
| 5,130,263 A | * | 7/1992 | Possin et al. .................. | 438/159 |
| 5,326,746 A | * | 7/1994 | Ohtani et al. .................. | 505/330 |
| 5,736,438 A | * | 4/1998 | Nishimura et al. ........... | 438/166 |
| 6,093,586 A | * | 7/2000 | Gosain et al. ................. | 438/162 |
| 6,548,416 B2 | * | 4/2003 | Han et al. ...................... | 438/710 |
| 7,491,569 B2 | * | 2/2009 | Fattinger et al. ............... | 438/53 |
| 2009/0023290 A1 | | 1/2009 | Chang et al. | |
| 2010/0317147 A1 | * | 12/2010 | Bettinelli ........................ | 438/98 |
| 2011/0027966 A1 | * | 2/2011 | Lee ................................ | 438/438 |

FOREIGN PATENT DOCUMENTS

| | | |
|---|---|---|
| KR | 1020050058594 | 6/2005 |
| KR | 10-2011-0044292 | 4/2011 |

* cited by examiner

*Primary Examiner* — Reema Patel

(74) *Attorney, Agent, or Firm* — Innovation Counsel LLP

(57) ABSTRACT

A method of planarizing a substrate includes forming a conductive pattern on a first surface of a base substrate, forming a positive photoresist layer on the base substrate and the conductive pattern, exposing the positive photoresist layer to light by irradiating a second surface of the base substrate opposite to the first surface with light, developing the positive photoresist layer to form a protruded portion on the conductive pattern, forming a planarizing layer on the base substrate and the protruded portion and eliminating the protruded portion.

11 Claims, 30 Drawing Sheets

LIGHT

LIGHT

METHOD OF PLANARIZING SUBSTRATE AND METHOD OF MANUFACTURING THIN FILM TRANSISTOR USING THE SAME

CROSS-REFERENCE TO RELATED APPLICATION

This application claims priority to Korean Patent Application No. 10-2012-0014935, filed on Feb. 14, 2012, and all the benefits accruing therefrom under 35 U.S.C. §119, the contents of which in its entirety is herein incorporated by reference.

BACKGROUND OF THE INVENTION

1. Field of the Invention

Exemplary embodiments relate to a method of planarizing a substrate and a method of manufacturing a thin film transistor using the method of planarizing a substrate. More particularly, exemplary embodiments relate to a method of planarizing a substrate to improve the reliability of a manufacturing process and a method of manufacturing a thin film transistor using the method of planarizing a substrate.

2. Description of the Related Art

Generally, a display apparatus includes an array substrate having a switching element and an opposite substrate facing the array substrate. The switching element includes a gate electrode electrically connected to a gate line, a semiconductor layer insulated from the gate electrode, a source electrode electrically connected to a data line and the semiconductor layer, and a drain electrode spaced apart from the source electrode and electrically connected to the semiconductor layer.

The array substrate and the switching element include a plurality of layers. When an upper surface of a layer is uneven, a pattern formed on the uneven surface may have a portion that is disconnected, so that the reliability of the display apparatus may decrease.

In addition, when the array substrate and the opposite substrate are not planarized, the cell gap between the array substrate and the opposite substrate is not uniform, so that a stain may be generated on the display panel. Thus, the display quality of the display apparatus may be deteriorated.

BRIEF SUMMARY OF THE INVENTION

A method of planarizing a substrate by forming a protruded portion on a conductive pattern to effectively planarize the substrate is provided.

A method of manufacturing a thin film transistor ("TFT") using the method of planarizing a substrate is also provided.

The method includes forming a conductive pattern on a first surface of a base substrate, forming a positive photoresist layer on the base substrate and the conductive pattern, exposing the positive photoresist layer to light by irradiating a second surface of the base substrate opposite to the first surface with light, developing the positive photoresist layer to form a protruded portion on the conductive pattern, forming a planarizing layer on the base substrate and the protruded portion and eliminating the protruded portion.

The conductive pattern may have a thickness between about 1 µm and about 3 µm.

The planarizing layer may be formed using a viscous liquid.

The planarizing layer may not react with the conductive pattern.

The protruded portion may be eliminated using a stripper that selectively reacts with the protruded portion.

The eliminating the protruded portion may include exposing the protruded portion from the planarizing layer covering the protruded portion.

The exposing the protruded portion may include ashing the planarizing layer.

The eliminating the protruded portion may include exposing the protruded portion to light and developing the protruded portion.

The eliminating the protruded portion may further include exposing the protruded portion from the planarizing layer covering the protruded portion.

The exposing the protruded portion may include ashing the planarizing layer.

The eliminating the protruded portion may include cracking the protruded portion and separating the cracked protruded portion from the conductive pattern.

The cracking the protruded portion may include irradiating the protruded portion with ultraviolet rays.

The cracking the protruded portion may include heating the protruded portion.

The cracked protruded portion may be separated from the conductive pattern using a stripper.

The cracked protruded portion may be physically separated from the conductive pattern using a roller or a scrubber.

In another aspect, a method of planarizing a substrate includes forming a conductive pattern on a first surface of a base substrate, forming a capping layer on the base substrate and the conductive pattern, forming a positive photoresist layer on the capping layer, exposing the positive photoresist layer to light by irradiating a second surface of the base substrate opposite to the first surface with light, developing the positive photoresist layer to form a protruded portion overlapping the conductive pattern, forming a planarizing layer on the capping layer and the protruded portion and eliminating the protruded portion.

The capping layer may include a transparent material.

In yet another aspect, a method of manufacturing a TFT includes forming a gate electrode on a first surface of a base substrate, forming a positive photoresist layer on the base substrate and the gate electrode, exposing the positive photoresist layer to light by irradiating a second surface of the base substrate opposite to the first surface with light, developing the positive photoresist layer to form a protruded portion on the gate electrode, forming a planarizing layer on the base substrate and the protruded portion, eliminating the protruded portion, forming a gate insulating layer on the planarizing layer and the gate electrode, forming a semiconductor layer overlapping the gate electrode on the gate insulating layer and forming a source electrode and a drain electrode on the semiconductor layer, the source electrode overlapping the semiconductor layer, the drain electrode overlapping the semiconductor layer, the drain electrode being spaced apart from the source electrode.

The gate electrode may have a thickness between about 1 µm and about 3 µm.

The planarizing layer may be formed using a viscous liquid.

The planarizing layer may not react to the gate electrode.

The protruded portion may be eliminated using a stripper that selectively reacts with the protruded.

The eliminating the protruded portion may include exposing the protruded portion to light and developing the protruded portion.

The eliminating the protruded portion may include cracking the protruded portion and separating the cracked protruded portion from the gate electrode.

In yet another aspect, a method of manufacturing a TFT includes forming a gate electrode on a first surface of a base substrate, forming a capping layer on the base substrate and the gate electrode, forming a positive photoresist layer on the capping layer, exposing the positive photoresist layer to light by irradiating a second surface of the base substrate opposite to the first surface with light, developing the positive photoresist layer to form a protruded portion overlapping the gate electrode, forming a planarizing layer on the capping layer and the protruded portion, eliminating the protruded portion, forming a semiconductor layer overlapping the gate electrode and forming a source electrode and a drain electrode on the semiconductor layer, the source electrode overlapping the semiconductor layer, the drain electrode overlapping the semiconductor layer, the drain electrode being spaced apart from the source electrode.

The method may further include forming a gate insulating layer on the planarizing layer before forming the semiconductor layer.

The method may further include etching the capping layer to expose the gate electrode before forming the gate insulating layer.

According to the method of planarizing a substrate and the method of manufacturing a TFT, the protruded portion is formed by a back exposure process so that a planarizing characteristic of layer may be improved.

Thus, the reliability of a display apparatus may be improved and the display quality of the display apparatus may be improved.

BRIEF DESCRIPTION OF THE DRAWINGS

The above and other features and advantages will become more apparent by describing in detail exemplary embodiments thereof with reference to the accompanying drawings, in which.

DETAILED DESCRIPTION OF THE INVENTION

Hereinafter, exemplary embodiments will be described in further detail with reference to the accompanying drawings.

Figure 1:
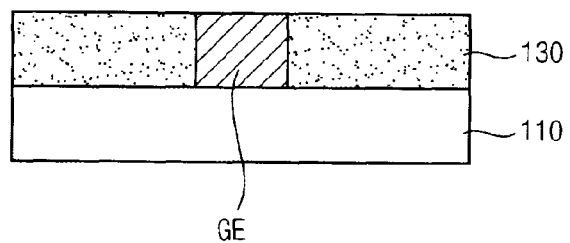
FIG. 1 is a cross-sectional view illustrating a substrate according to an exemplary embodiment.

FIG. 1 is a cross-sectional view illustrating a substrate according to an exemplary embodiment.

Referring to FIG. 1, the substrate includes a base substrate 110, a conductive pattern GE and a planarizing layer 130 disposed on the base substrate 110. For example, the conductive pattern GE may be a gate electrode of a thin film transistor ("TFT"), which is a switching element of a display apparatus.

The conductive pattern GE may have a relatively thick thickness. For example, a thickness of the conductive pattern GE may be equal to or greater than about 1 μm. For example, a thickness of the conductive pattern GE may be between about 1 μm and about 3 μm.

The conductive pattern GE has a relatively thick thickness so that a resistance of the conductive pattern GE may decrease. Thus, a display panel may be driven in a relatively high speed. In addition, the conductive pattern GE has a relatively thick thickness so that the area of the conductive pattern GE may be decreased. Thus, an aperture ratio of the display panel may be improved.

The planarizing layer 130 planarizes the substrate. The planarizing layer 130 may be formed in a position corresponding to entire surface of the base substrate 110, so as to cover the base substrate 110 except for the area of the conductive pattern GE.

The planarizing layer 130 may not be formed on the conductive pattern GE. Alternatively, the planarizing layer 130 may be formed on the conductive pattern GE in a relatively thin thickness as compared to the thickness of the planarizing layer 130 formed in the area in which the conductive pattern GE is not disposed.

FIGS. 2A to 2E are cross-sectional views illustrating a method of planarizing the substrate of FIG. 1.

Hereinafter, the method of planarizing the substrate of FIG. 1 may be explained in detail referring to FIGS. 2A to 2E.

Figure 2A:
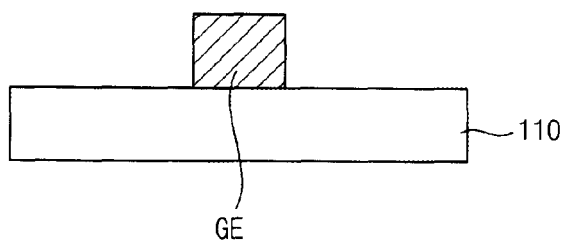
FIGS. 2A to 2E are cross-sectional views illustrating a method of planarizing the substrate of FIG. 1.

Referring to FIG. 2A, the conductive pattern GE is formed on a first surface of the base substrate 110. The conductive pattern GE may be formed by a photoresist process using a first mask. Alternatively, the conductive pattern GE may be formed using an organic layer having a first trench corresponding to a shape of the conductive pattern GE. The first trench may be formed by a dry etching process in the organic layer.

The conductive pattern GE may include, for example, one of aluminum (Al), copper (Cu), molybdenum (Mo) and titanium (Ti) or an alloy thereof. For example, the conductive pattern GE may include a transparent conductive material such as an indium tin oxide (ITO), an indium zinc oxide (IZO) and an aluminum doped zinc oxide (AZO), which transmits a visible ray. The conductive pattern GE selectively or totally blocks light from a second surface of the base substrate 110 opposite to the first surface of the base substrate in a back exposure process. The present invention is not limited to a material of the conductive pattern GE.

The conductive pattern GE may have a single layer structure. Alternatively, the conductive pattern GE may have a multi-layer structure which includes a plurality of conductive layers or at least one conductive layer and at least one insulating layer.

Figure 2B:
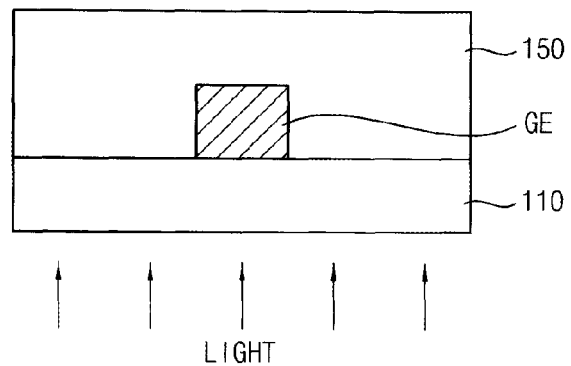

Referring to FIG. 2B, a positive photoresist layer 150 is formed on the base substrate 110 and the conductive pattern GE. The positive photoresist layer 150 may be coated on the base substrate 110 and the conductive pattern GE.

The second surface of the base substrate 110 opposite to the first surface on which the conductive pattern GE is formed is irradiated with light. The positive photoresist layer 150 is exposed to the light entering through the second surface of the base substrate 110. The positive photoresist layer 150 is exposed to the light by a back exposure process. A portion of the positive photoresist layer 150 positioned over the conductive pattern GE is not exposed to the light, but a portion of the positive photoresist layer 150 not positioned over the conductive pattern GE is exposed to the light.

Figure 2C:
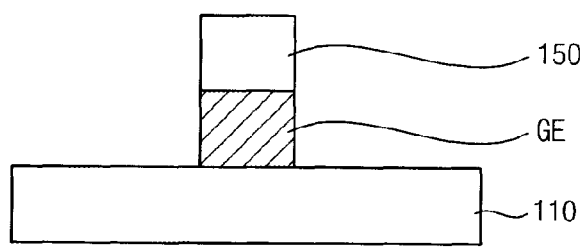

Referring to FIG. 2C, the exposed positive photoresist layer 150 is developed. The positive photoresist layer 150 includes a positive photoresist material so that the portion exposed to the light is eliminated and the portion not exposed to the light remains on the conductive pattern GE. As a result, a protruded portion 150 is formed on the conductive pattern GE.

The positive photoresist layer 150 may be developed using a developer. The positive photoresist layer 150 makes contact with the developer during a development time so that the portion not corresponding to the conductive pattern GE may be eliminated.

For example, a thickness of the protruded portion 150 may be substantially equal to the thickness of the conductive pattern GE. The thickness of the protruded portion 150 may be greater than the thickness of the conductive pattern GE. The thickness of the protruded portion 150 may be determined according to the viscosity and planarizing characteristics of the planarizing layer 130.

Figure 2D:
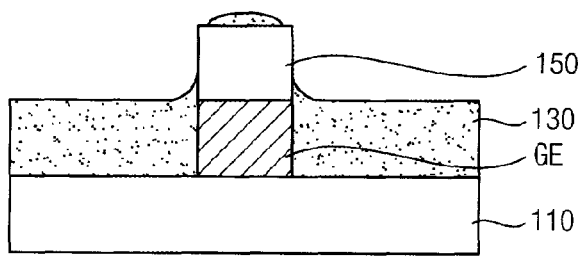

Referring to FIG. 2D, the planarizing layer 130 is formed on the base substrate 110 and the protruded portion 150. The planarizing layer 130 may be coated onto the base substrate 110 and the protruded portion 150.

The planarizing layer 130 may be formed using a viscous liquid having a relatively high viscosity. When the planarizing layer 130 is formed, the planarizing material having a relatively high viscosity flows to portions surrounding the conductive pattern GE on the base substrate 110.

The protruded portion 150 is formed on the conductive pattern GE so that, due to the higher potential energy of the planarizing material laid over the protruded portion 150, the planarization material flows from the top of the protruded portion 150 towards to the base substrate 110. Thus, a planarizing characteristic of the planarizing layer 130 is improved.

The planarizing layer 130 may include a material which does not react to the conductive pattern GE. A material of the conductive pattern GE does not diffuse into the planarizing layer 130. Thus, a conductive characteristic of the conductive pattern GE does not decrease.

According to a characteristic of the planarizing material of the planarizing layer 130, the planarizing layer 130 may cover a portion of an upper surface and a portion of a side surface of the protruded portion 150. When the planarizing layer 130 covers the portion of the upper surface and the portion of the side surface of the protruded portion 150, the protruded portion 150 may be eliminated using a stripper that selectively reacts with the protruded portion 150 but not the planarizing layer 130. For example, the stripper may be a stripping solution. After use of the stripper, the planarizing layer 130 and the conductive pattern GE remain on the base substrate 110, while the protruded portion 150 is eliminated.

Figure 2E:
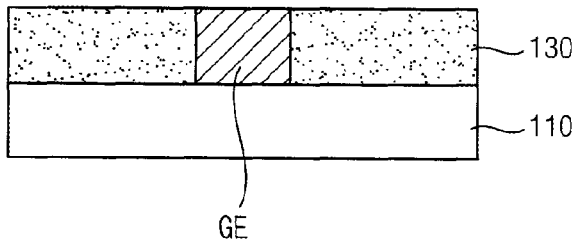

Referring to FIG. 2E, the protruded portion 150 is eliminated so that the substrate, on which the conductive pattern GE is formed, is planarized.

According to the present exemplary embodiment, after the protruded portion 150 is temporally formed on the conductive pattern GE by a back exposure process, the planarizing layer 130 is formed so that the planarizing characteristic of the planarizing layer 130 may be improved.

FIGS. 3A to 3E are cross-sectional views illustrating a method of planarizing a substrate according to another exemplary embodiment.

The method of planarizing the substrate of the present exemplary embodiment is substantially the same as the method of planarizing the substrate explained referring to FIGS. 1 and 2A to 2E, except for a method of eliminating the protruded portion 150. Thus, the same reference numerals will be used to refer to the same or like parts as those described in FIGS. 1 and 2A to 2E and any repetitive explanation concerning the above elements will be omitted.

Hereinafter, the method of planarizing the substrate may be explained in detail referring to FIGS. 3A to 3E.

Figure 3A:
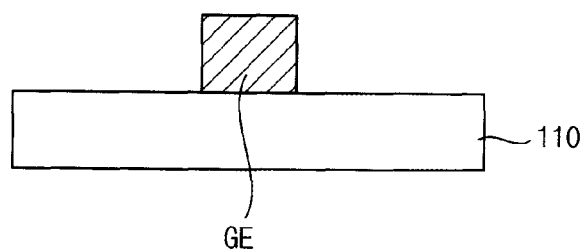
FIGS. 3A to 3E are cross-sectional views illustrating a method of planarizing a substrate according to another exemplary embodiment.

Referring to FIG. 3A, the conductive pattern GE is formed on a first surface of the base substrate 110.

Figure 3B:
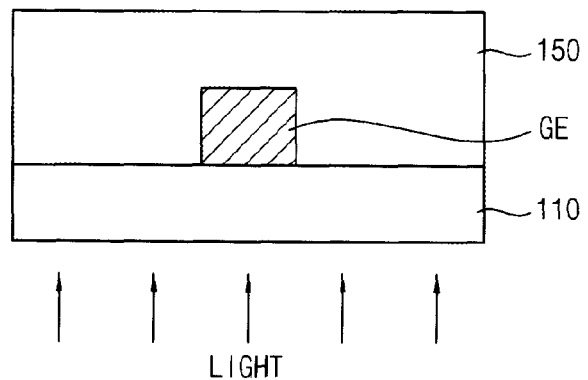

Referring to FIG. 3B, a positive photoresist layer 150 is formed on the base substrate 110 and the conductive pattern GE. The second surface of the base substrate 110 opposite to the first surface on which the conductive pattern GE is formed is irradiated with light. The positive photoresist layer 150 is exposed to the light entering through the second surface of the base substrate 110.

Figure 3C:
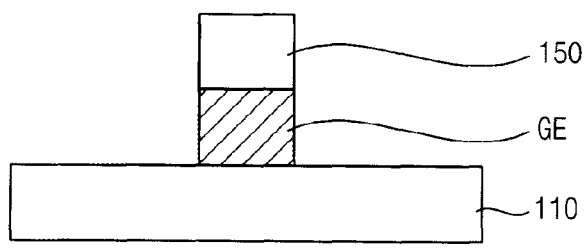

Referring to FIG. 3C, the exposed positive photoresist layer 150 is developed to form a protruded portion 150 on the conductive pattern GE.

Figure 3D:
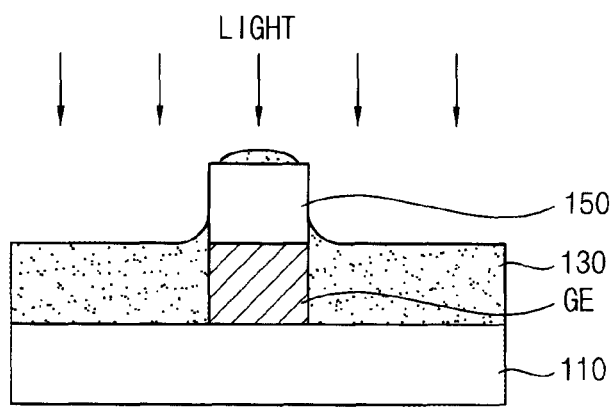

Referring to FIG. 3D, the planarizing layer 130 is formed on the base substrate 110 and the protruded portion 150. The planarizing layer 130 may be coated on the base substrate 110 and the protruded portion 150.

The planarizing layer 130 may be formed using a viscous liquid having a relatively high viscosity. When the planarizing layer 130 is formed, the planarizing material having the relatively high viscosity flows to portions surrounding the conductive pattern GE on the base substrate 110.

The protruded portion 150 is formed on the conductive pattern GE so that, due to the higher potential energy of the planarizing material laid over the protruded portion 150, the planarizing material flows from the protruded portion 150 toward the base substrate 110. Thus, a planarizing characteristic of the planarizing layer 130 is improved.

The planarizing layer 130 may include a material which does not react with the material used to form the conductive pattern GE. Additionally, the material used to form the conductive pattern GE does not diffuse into the planarizing layer 130. Thus, the conductive characteristics of the conductive pattern GE do not decrease.

According to a characteristic of the planarizing material of the planarizing layer 130, the planarizing layer 130 may cover a portion of an upper surface and a portion of a side surface of the protruded portion 150. When the planarizing layer 130 covers the portion of the upper surface and the portion of the side surface of the protruded portion 150, the protruded portion 150 may be eliminated by exposing the protruded portion 150 to the light and developing the protruded portion 150. Herein, the protruded portion 150 is exposed to the light by a front exposure process, in which light is directed toward the side of the substrate 110 which has the protruded portion.

A portion of the upper surface and a portion of the side surface are not covered by the planarizing material so that the protruded portion 150 is eliminated by irradiating it with the light and developing the protruded portion 150. As a result, the planarizing layer 130 and the conductive pattern GE remain on the base substrate 110 and the protruded portion 150 is eliminated.

Figure 3E:
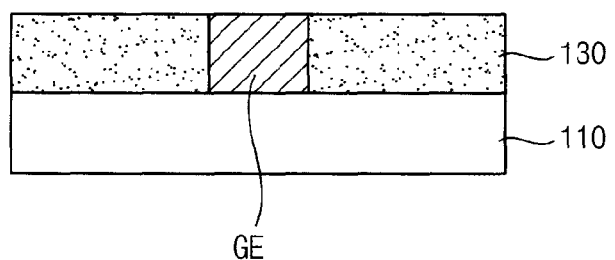

Referring to FIG. 3E, the protruded portion 150 is eliminated so that the substrate, on which the conductive pattern GE is formed, is planarized.

According to the present exemplary embodiment, after the protruded portion 150 is temporally formed on the conductive pattern GE by a back exposure process, the planarizing layer 130 is formed so that the planarizing characteristic of the planarizing layer 130 may be improved.

FIGS. 4A to 4F are cross-sectional views illustrating a method of planarizing a substrate according to still another exemplary embodiment.

The method of planarizing the substrate of the present exemplary embodiment is substantially the same as the method of planarizing the substrate explained referring to FIGS. 1 and 2A to 2E, except for a method of eliminating the protruded portion 150. Thus, the same reference numerals will be used to refer to the same or like parts as those described in FIGS. 1 and 2A to 2E and any repetitive explanation concerning the above elements will be omitted.

Hereinafter, the method of planarizing the substrate may be explained in detail referring to FIGS. 4A to 4F.

Figure 4A:
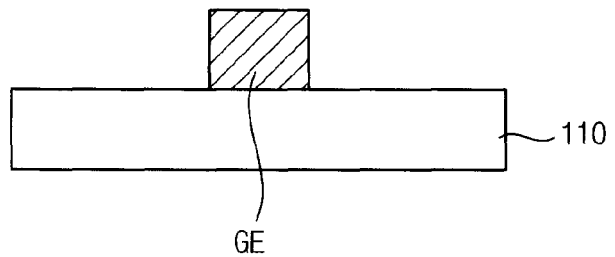
FIGS. 4A to 4F are cross-sectional views illustrating a method of planarizing a substrate according to still another exemplary embodiment.

Referring to FIG. 4A, the conductive pattern GE is formed on a first surface of the base substrate 110.

Figure 4B:
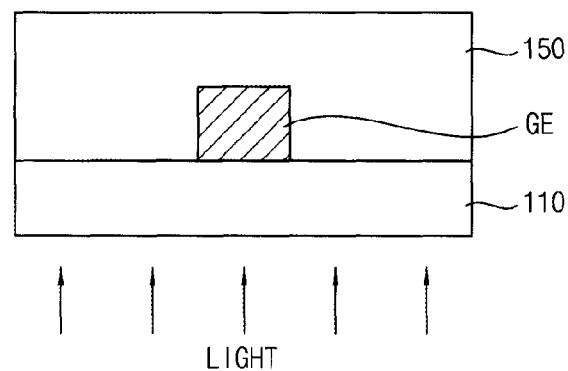

Referring to FIG. 4B, a positive photoresist layer 150 is formed on the base substrate 110 and the conductive pattern GE. The second surface of the base substrate 110 opposite to the first surface on which the conductive pattern GE is formed is irradiated with light. The positive photoresist layer 150 is exposed to the light entering through the second surface of the base substrate 110.

Figure 4C:
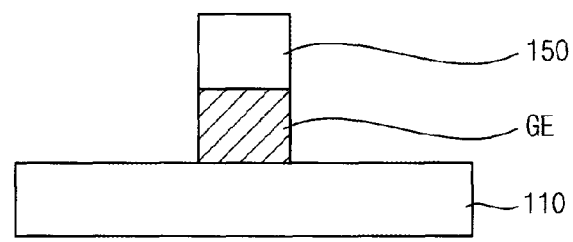

Referring to FIG. 4C, the exposed positive photoresist layer 150 is developed to form the protruded portion 150 on the conductive pattern GE.

Figure 4D:
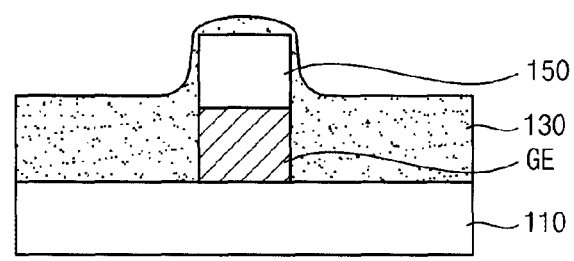

Referring to FIG. 4D, the planarizing layer 130 is formed on the base substrate 110 and the protruded portion 150. The planarizing layer 130 may be coated on the base substrate 110 and the protruded portion 150.

The planarizing layer 130 may be formed using a viscous liquid having a relatively high viscosity. When the planarizing layer 130 is formed, the planarizing material having the relatively high viscosity flows to portions surrounding the conductive pattern GE on the base substrate 110.

The protruded portion 150 is formed on the conductive pattern GE so that, due to the increase in the potential energy of the planarizing material to from the protruded portion 150, the planarization material laid over the protruded portion 150 flows toward the base substrate 110. Thus, a planarizing characteristic of the planarizing layer 130 is improved.

The planarizing layer 130 may include a material which does not react with the material used to form the conductive pattern GE. Additionally, the material used to form the conductive pattern GE does not diffuse into the planarizing layer 130. Thus, the conductive characteristics of the conductive pattern GE do not decrease.

According to the characteristics of the planarizing material of the planarizing layer 130, the planarizing layer 130 may, as shown in FIG. 4D, completely cover an upper surface and a side surface of the protruded portion 150. When the planarizing layer 130 completely covers the upper surface and the side surface of the protruded portion 150, the protruded portion 150 may be required to be partially exposed from the planarizing layer 130 to eliminate the protruded portion 150. To remove the portion of the planarization layer 130 on the upper surface of the protruded portion 150, the planarizing layer 130 on the upper surface of the protruded portion 150 and the base substrate 110 is ashed, so that the protruded portion 150 may be exposed. For example, the planarizing layer 130 may be ashed by oxygen plasma.

Figure 4E:
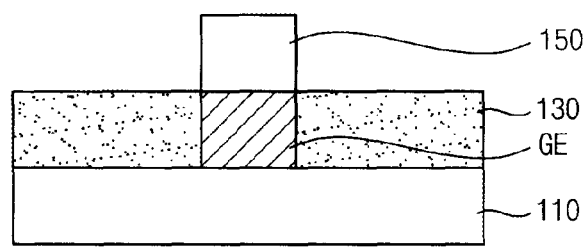

Referring to FIG. 4E, the protruded portion 150 of which a portion is exposed may be eliminated using a stripper that selectively reacts with the protruded portion 150 but not the planarizing layer 130. For example, the stripper may be a stripping solution. After use of the stripper, the planarizing layer 130 and the conductive pattern GE remain on the base substrate 110, while the protruded portion 150 is eliminated.

Figure 4F:
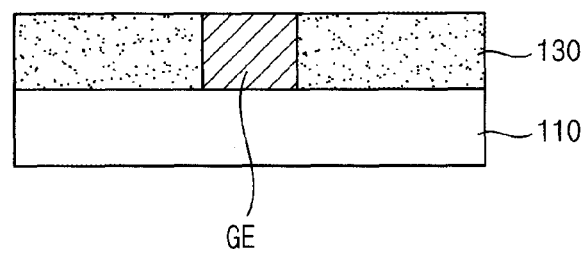

Referring to FIG. 4F, the protruded portion 150 is eliminated so that the substrate, on which the conductive pattern GE is formed, is planarized.

According to the present exemplary embodiment, after the protruded portion 150 is temporally formed on the conductive pattern GE by a back exposure process, the planarizing layer 130 is formed so that the planarizing characteristic of the planarizing layer 130 may be improved.

FIGS. 5A to 5F are cross-sectional views illustrating a method of planarizing a substrate according to still another exemplary embodiment.

The method of planarizing the substrate of the present exemplary embodiment is substantially the same as the method of planarizing the substrate explained referring to FIGS. 1 and 2A to 2E, except for a method of eliminating the protruded portion 150. Thus, the same reference numerals will be used to refer to the same or like parts as those described in FIGS. 1 and 2A to 2E and any repetitive explanation concerning the above elements will be omitted.

Hereinafter, the method of planarizing the substrate may be explained in detail referring to FIGS. 5A to 5F.

Figure 5A:
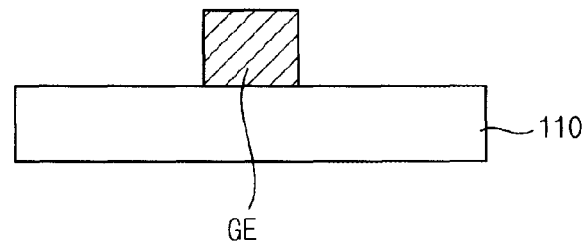
FIGS. 5A to 5F are cross-sectional views illustrating a method of planarizing a substrate according to still another exemplary embodiment.

Referring to FIG. 5A, the conductive pattern GE is formed on a first surface of the base substrate 110.

Figure 5B:
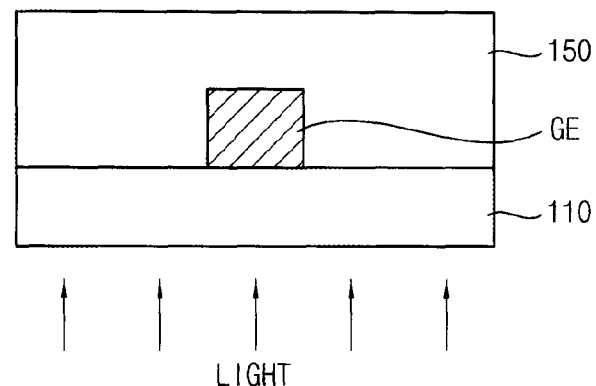

Referring to FIG. 5B, a positive photoresist layer 150 is formed on the base substrate 110 and the conductive pattern GE. The second surface of the base substrate 110 opposite to the first surface on which the conductive pattern GE is formed is irradiated with light. The positive photoresist layer 150 is exposed to the light entering through the second surface of the base substrate 110.

Figure 5C:
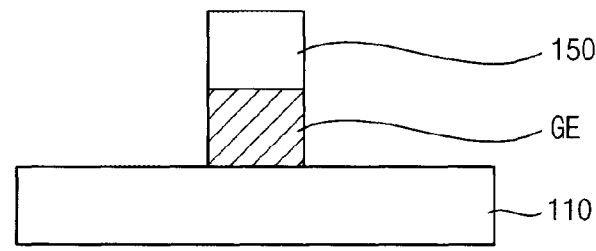

Referring to FIG. 5C, the exposed positive photoresist layer 150 is developed to form a protruded portion on the conductive pattern GE.

Figure 5D:
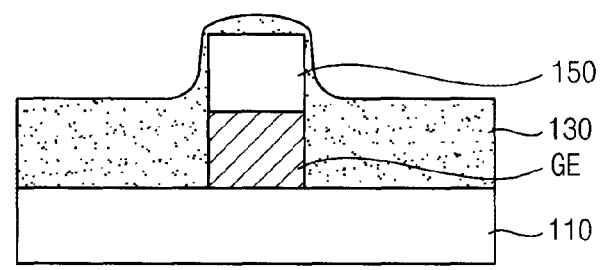

Referring to FIG. 5D, the planarizing layer 130 is formed on the base substrate 110 and the protruded portion 150. The planarizing layer 130 may be coated on the base substrate 110 and the protruded portion 150.

The planarizing layer 130 may be formed using a viscous liquid having a relatively high viscosity. When the planarizing layer 130 is formed, the planarizing material having the relatively high viscosity flows to portions surrounding the conductive pattern GE on the base substrate 110.

For example, the planarizing material may include an organic-inorganic composite material. For example, the planarizing material may include Siloxane. For example, the planarizing material may include Silsesquioxane.

The protruded portion 150 is formed on the conductive pattern GE so that, due to the higher potential energy of the planarizing material laid over the protruded portion 150, the planarizing material flows from the protruded portion 150 toward the base substrate 110. Thus, a planarizing characteristic of the planarizing layer 130 is improved.

The planarizing layer 130 may include a material which does not react with the material used to form the conductive pattern GE. Additionally, the material used to form the conductive pattern GE does not diffuse into the planarizing layer 130. Thus, the conductive characteristics of the conductive pattern GE do not decrease.

According to a characteristic of the planarizing material of the planarizing layer 130, the planarizing layer 130 may completely cover an upper surface and a side surface of the protruded portion 150. When the planarizing layer 130 completely covers the upper surface and the side surface of the protruded portion 150, the protruded portion 150 may be required to be exposed from the planarizing layer 130 to eliminate the protruded portion 150. To remove the portion of the planarization layer 130 on the upper surface of the protruded portion 150, the planarizing layer 130 on the upper surface of the protruded portion 150 and the base substrate 110 is ashed so that the protruded portion 150 may be exposed. For example, the planarizing layer 130 may be ashed by oxygen plasma.

Figure 5E:
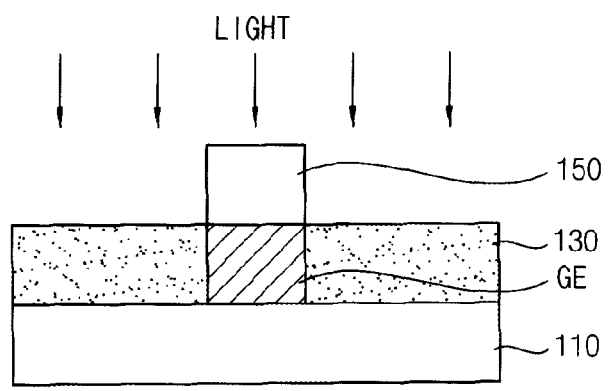

Referring to FIG. 5E, the protruded portion 150 of which a portion is exposed may be eliminated by exposing the protruded portion 150 to light and developing the protruded portion 150. Herein, the protruded portion 150 is exposed to the light by a front exposure process, in which light is directed toward the side of the substrate 110 which has the protruded portion.

The upper surface of the protruded portion 150 is not covered by the planarizing material so that the protruded portion 150 is eliminated by irradiating it with the light and developing the protruded portion 150. As a result, the planarizing layer 130 and the conductive pattern GE remain on the base substrate 110 and the protruded portion 150 is eliminated.

Figure 5F:
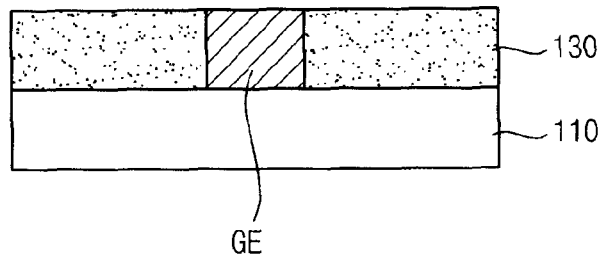

Referring to FIG. 5F, the protruded portion 150 is eliminated so that the substrate, on which the conductive pattern GE is formed, is planarized.

According to the present exemplary embodiment, after the protruded portion 150 is temporally formed on the conductive pattern GE by a back exposure process, the planarizing layer 130 is formed so that the planarizing characteristic of the planarizing layer 130 may be improved.

FIGS. 6A to 6F are cross-sectional views illustrating a method of planarizing a substrate according to still another exemplary embodiment.

The method of planarizing the substrate of the present exemplary embodiment is substantially the same as the method of planarizing the substrate explained referring to FIGS. 1 and 2A to 2E, except for a method of eliminating the protruded portion 150. Thus, the same reference numerals will be used to refer to the same or like parts as those described in FIGS. 1 and 2A to 2E and any repetitive explanation concerning the above elements will be omitted.

Hereinafter, the method of planarizing the substrate may be explained in detail referring to FIGS. 6A to 6F.

Figure 6A:
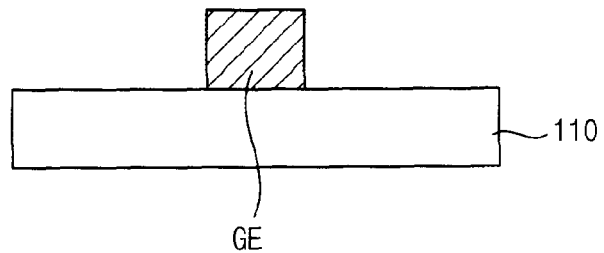
FIGS. 6A to 6F are cross-sectional views illustrating a method of planarizing a substrate according to still another exemplary embodiment.

Referring to FIG. 6A, the conductive pattern GE is formed on a first surface of the base substrate 110.

Figure 6B:
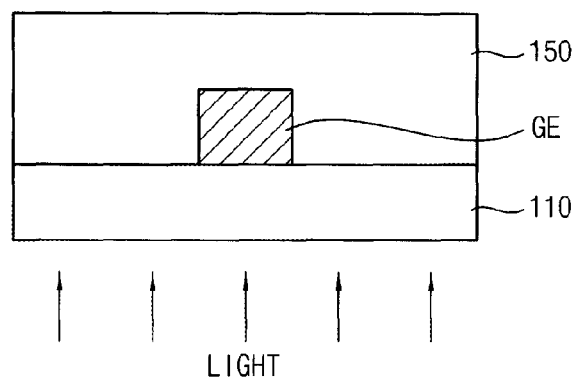

Referring to FIG. 6B, a positive photoresist layer 150 is formed on the base substrate 110 and the conductive pattern GE. The second surface of the base substrate 110 opposite to the first surface on which the conductive pattern GE is formed is irradiated with light. The positive photoresist layer 150 is exposed to the light entering through the second surface of the base substrate 110.

Figure 6C:
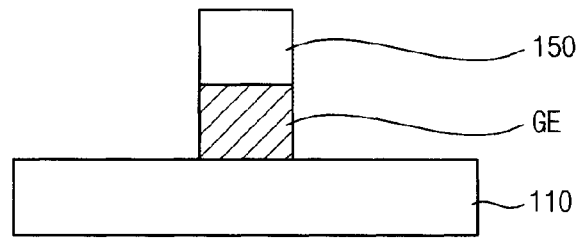

Referring to FIG. 6C, the exposed positive photoresist layer 150 is developed to form a protruded portion 150 on the conductive pattern GE.

Figure 6D:
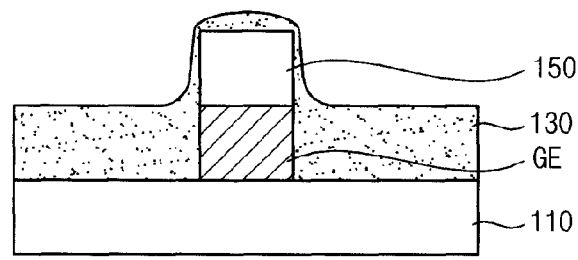

Referring to FIG. 6D, the planarizing layer 130 is formed on the base substrate 110 and the protruded portion 150. The planarizing layer 130 may be coated on the base substrate 110 and the protruded portion 150.

The planarizing layer 130 may be formed using a viscous liquid having a relatively high viscosity. When the planarizing layer 130 is formed, the planarizing material having the relatively high viscosity flows to portions surrounding the conductive pattern GE on the base substrate 110.

The protruded portion 150 is formed on the conductive pattern GE so that, due to the higher potential energy of the planarizing material laid over the protruded portion 150, the planarizing material flows from the protruded portion 150 toward the base substrate 110. Thus, a planarizing characteristic of the planarizing layer 130 is improved.

The planarizing layer 130 may include a material which does not react with the material used to form the conductive pattern GE. Additionally, the material used to form the conductive pattern GE does not diffuse into the planarizing layer 130. Thus, the conductive characteristics of the conductive pattern GE do not decrease.

According to a characteristic of the planarizing material of the planarizing layer 130, the planarizing layer 130 may completely cover an upper surface and a side surface of the protruded portion 150.

Figure 6E:
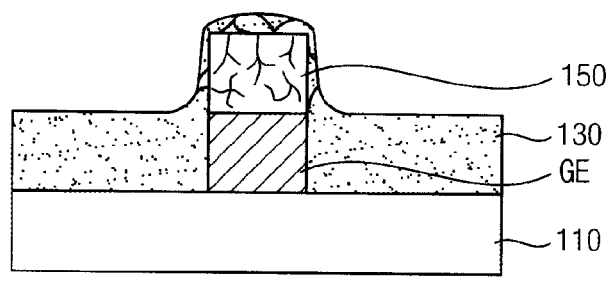

Referring to FIG. 6E, when the planarizing layer 130 completely covers the upper surface and the side surface of the protruded portion 150, cracks may be caused in the protruded portion 150. The cracked protruded portion 150 may thus be separated from the conductive pattern GE.

To create cracks in the protruded portion 150, the protruded portion 150 may be irradiated with an ultraviolet ray. Alternatively, the protruded portion 150 may be heated to create cracks in the protruded portion 150.

The positive photoresist material of the protruded portion 150 is cracked by the ultraviolet ray or the heat so that the adherence between the protruded portion 150 and the conductive pattern GE decreases.

The cracked protruded portion 150 may be separated from the conductive pattern GE using a stripper. The stripper may be absorbed into cracks in the planarizing layer 130, and may separate the cracked protruded portion 150 from the conductive pattern GE.

Alternatively, the cracked protruded portion 150 may be physically separated from the conductive pattern GE using a roller or a scrubber. The adherence between the cracked protruded portion 150 and the conductive pattern GE is decreased as a result of the cracks, so that the cracked protruded portion 150 may be separated from the conductive pattern GE when it is pushed by the roller or the scrubber.

Figure 6F:
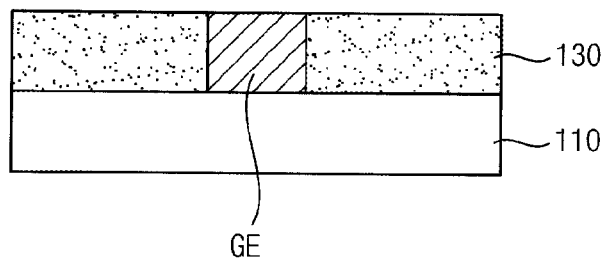

Referring to FIG. 6F, the protruded portion 150 is eliminated so that the substrate, on which the conductive pattern GE is formed, is planarized.

According to the present exemplary embodiment, after the protruded portion 150 is temporally formed on the conductive pattern GE by a back exposure process, the planarizing layer 130 is formed so that the planarizing characteristic of the planarizing layer 130 may be improved.

Figure 7:
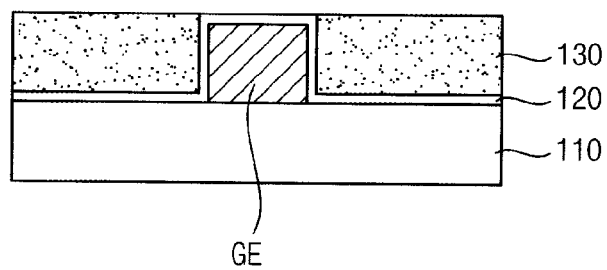
FIG. 7 is a cross-sectional view illustrating a substrate according to still another exemplary embodiment.

FIG. 7 is a cross-sectional view illustrating a substrate according to still another exemplary embodiment. FIGS. 8A to 8F are cross-sectional views illustrating a method of planarizing the substrate of FIG. 7.

The substrate of the present exemplary embodiment is substantially the same as the substrate in FIG. 1, except that the substrate further includes a capping layer 120. The method of planarizing the substrate of the present exemplary embodiment is substantially the same as the method of planarizing the substrate explained referring to FIGS. 2A to 2E, except that a method of planarizing the substrate further includes forming the capping layer 120. Thus, the same reference numerals will be used to refer to the same or like parts as those described in FIGS. 1 and 2A to 2E and any repetitive explanation concerning the above elements will be omitted.

Referring to FIG. 7, the substrate includes a base substrate 110, a conductive pattern GE disposed on the base substrate 110, a capping layer 120 disposed on the base substrate 110 and the conductive pattern GE, and a planarizing layer 130 disposed on the capping layer 120. For example, the conductive pattern GE may be a gate electrode of a thin film transistor ("TFT"), which is a switching element of a display apparatus.

The conductive pattern GE may have a relatively thick thickness. For example, a thickness of the conductive pattern GE may be equal to or greater than about 1 μm. For example, a thickness of the conductive pattern GE may be between about 1 μm and about 3 μm.

The conductive pattern GE has a relatively thick thickness so that a resistance of the conductive pattern GE may decrease. Thus, a display panel may be driven at a relatively high speed. In addition, the conductive pattern GE has a relatively thick thickness so that the area of the conductive pattern GE may be decreased. Thus, an aperture ratio of the display panel may be improved.

The capping layer 120 prevents the conductive pattern GE from reacting with the planarizing layer 130. The capping layer 120 prevents the conductive pattern GE from diffusing into the planarizing layer 130, so that the conductive characteristics of the conductive pattern GE are not deteriorated.

The capping layer 120 includes a transparent material. The capping layer 120 transmits light. The capping layer 120 transmits light from a second surface of the base substrate 110 opposite to a first surface of the base substrate on which the conductive pattern GE is formed in a back exposure process.

The capping layer 120 may include an insulating material. When the conductive pattern GE is gate electrode, the capping layer 120 may be a gate insulating layer.

The planarizing layer 130 planarizes the substrate. The planarizing layer 130 may be formed in a position corresponding to entire surface of the base substrate 110, so as to cover the base substrate 110 except for the area of the conductive pattern GE.

The planarizing layer 130 may not be formed on the conductive pattern GE. Alternatively, the planarizing layer 130 may be formed on the conductive pattern GE in a relatively thin thickness as compared to the thickness of the planarizing layer 130 formed in the area in which the conductive pattern GE is not disposed.

Hereinafter, the method of planarizing the substrate of FIG. 7 may be explained in detail referring to FIGS. 8A to 8F.

Figure 8A:
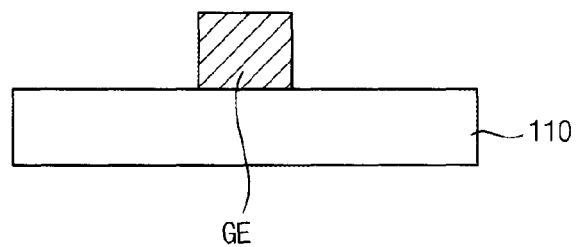
FIGS. 8A to 8F are cross-sectional views illustrating a method of planarizing the substrate of FIG. 7.

Referring to FIG. 8A, the conductive pattern GE is formed on the first surface of the base substrate 110.

Figure 8B:
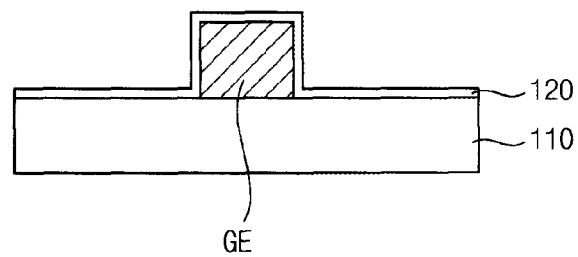

Referring to FIG. 8B, the capping layer 120 is formed on the base substrate 110 and the conductive pattern GE.

Figure 8C:
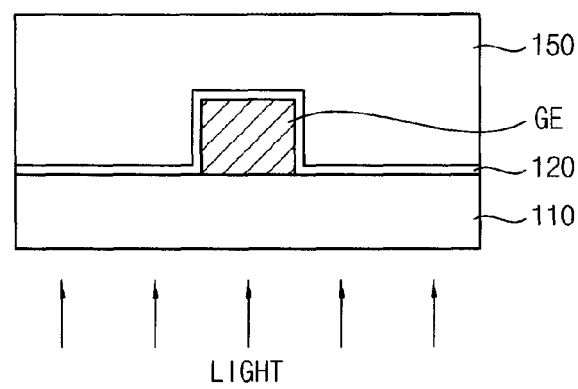

Referring to FIG. 8C, a positive photoresist layer 150 is formed on the capping layer 120. The second surface of the base substrate 110 opposite to the first surface on which the conductive pattern GE is formed is irradiated with light. The positive photoresist layer 150 is exposed to the light entering through the second surface of the base substrate 110. The light from the second surface of the base substrate 110 passes through the capping layer 120.

Figure 8D:
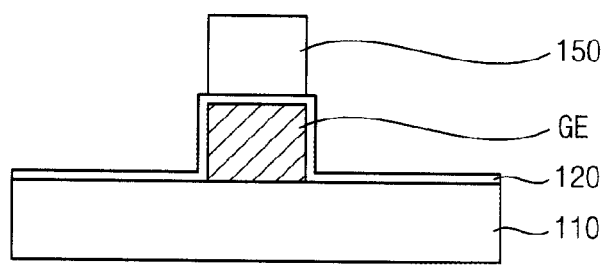

Referring to FIG. 8D, the exposed positive photoresist layer 150 is developed so that a protruded portion 150 is formed on the capping layer 120 overlapping the conductive pattern GE.

Figure 8E:
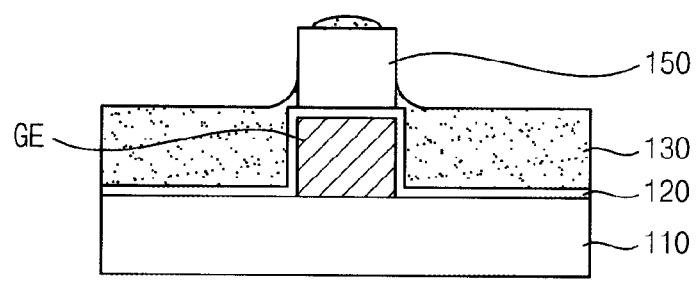

Referring to FIG. 8E, the planarizing layer 130 is formed on the capping layer 120 and the protruded portion 150. The planarizing layer 130 may be coated on the capping layer 120 and the protruded portion 150.

The planarizing layer 130 may be formed using a viscous liquid having a relatively high viscosity. When the planarizing layer 130 is formed, the planarizing material having the relatively high viscosity flows to portions surrounding the conductive pattern GE on the capping layer 120.

The protruded portion 150 is formed on the conductive pattern GE so that, due to the higher potential energy of the planarizing material laid over the protruded portion 150, the planarizing material flows from the protruded portion 150 toward the capping layer 120. Thus, a planarizing characteristic of the planarizing layer 130 is improved.

The planarizing layer 130 may include a material that does not react with, or absorb through the material used to form the capping layer 120, and thus the conductive pattern GE is protected, and the conductive characteristic of the conductive pattern GE is not deteriorated.

According to a characteristic of the planarizing material of the planarizing layer 130, the planarizing layer 130 may cover a portion of an upper surface and a portion of a side surface of the protruded portion 150. When the planarizing layer 130 covers the portion of the upper surface and the portion of the side surface of the protruded portion 150, the protruded portion 150 may be eliminated using a stripper as explained referring to FIG. 2D, or by the exposing and developing processes as explained referring to FIG. 3D.

Figure 8F:
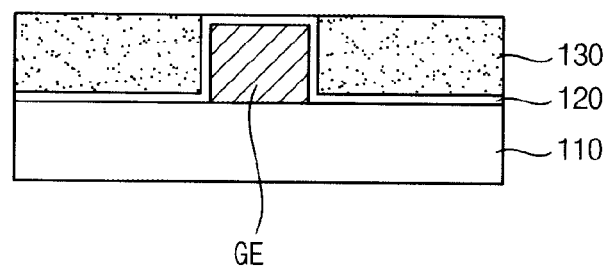

Referring to FIG. 8F, the protruded portion 150 is eliminated so that the substrate, on which the conductive pattern GE is formed, is planarized.

According to the present exemplary embodiment, after the protruded portion 150 is temporally formed on the conductive pattern GE by a back exposure process, the planarizing layer 130 is formed so that the planarizing characteristic of the planarizing layer 130 may be improved.

FIGS. 9A to 9F are cross-sectional views illustrating a method of planarizing a substrate according to still another exemplary embodiment.

The method of planarizing the substrate of the present exemplary embodiment is substantially the same as the method of planarizing the substrate explained referring to FIGS. 7 and 8A to 8F, except for a method of eliminating the protruded portion 150. Thus, the same reference numerals will be used to refer to the same or like parts as those described in FIGS. 7 and 8A to 8F and any repetitive explanation concerning the above elements will be omitted.

Hereinafter, the method of planarizing the substrate may be explained in detail referring to FIGS. 9A to 9F.

Figure 9A:
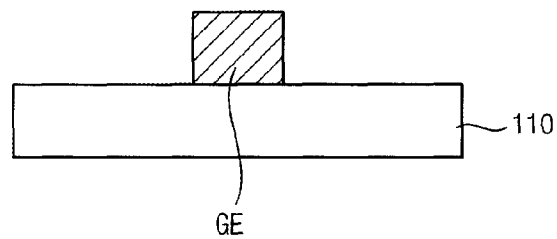
FIGS. 9A to 9F are cross-sectional views illustrating a method of planarizing a substrate according to still another exemplary embodiment.

Referring to FIG. 9A, the conductive pattern GE is formed on the first surface of the base substrate 110.

Figure 9B:
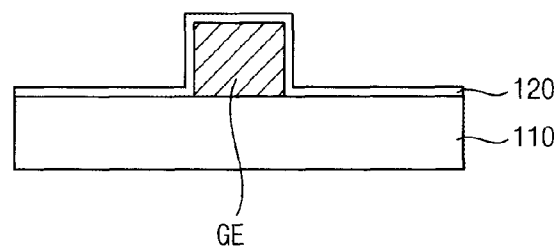

Referring to FIG. 9B, the capping layer 120 is formed on the base substrate 110 and the conductive pattern GE.

Figure 9C:
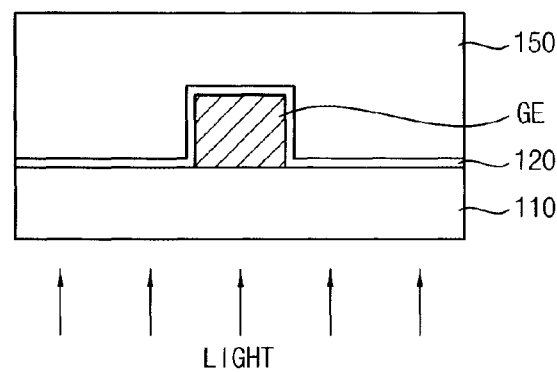

Referring to FIG. 9C, a positive photoresist layer 150 is formed on the capping layer 120. The second surface of the base substrate 110 opposite to the first surface on which the conductive pattern GE is formed is irradiated with light. The positive photoresist layer 150 is exposed to the light entering through the second surface of the base substrate 110. The light from the second surface of the base substrate 110 passes through the capping layer 120.

Figure 9D:
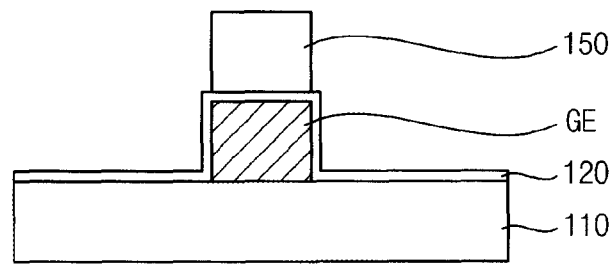

Referring to FIG. 9D, the exposed positive photoresist layer 150 is developed so that a protruded portion 150 is formed on the capping layer 120 overlapping the conductive pattern GE.

Figure 9E:
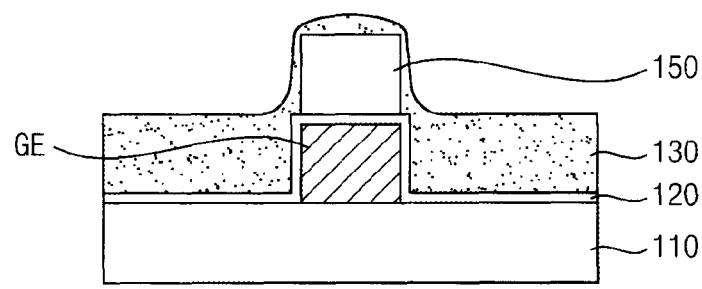

Referring to FIG. 9E, the planarizing layer 130 is formed on the capping layer 120 and the protruded portion 150. The planarizing layer 130 may be coated on the capping layer 120 and the protruded portion 150.

The planarizing layer 130 may be formed using a viscous liquid having a relatively high viscosity. When the planarizing layer 130 is formed, a planarizing material having a relatively high viscosity flows to portions surrounding the conductive pattern GE on the capping layer 120.

The protruded portion 150 is formed on the conductive pattern GE so that, due to the higher potential energy of the planarizing material laid over the protruded portion 150, the planarizing material flows from the protruded portion 150 toward the capping layer 120. Thus, a planarizing characteristic of the planarizing layer 130 is improved.

The planarizing layer 130 may include a material that does not react with, or absorb through the material used to form the capping layer 120, and thus the conductive pattern GE is protected, and the conductive characteristic of the conductive pattern GE is not deteriorated.

According to a characteristic of the planarizing material of the planarizing layer 130, the planarizing layer 130 may completely cover an upper surface and a side surface of the protruded portion 150. When the planarizing layer 130 completely covers the upper surface and the side surface of the protruded portion 150, the protruded portion 150 may be required to be exposed from the planarizing layer 130 to eliminate the protruded portion 150. The protruded portion 150 may be eliminated by using a stripper as explained referring to FIG. 4E, or by the exposing and developing processes as explained referring to FIG. 5E. Alternatively, the protruded portion 150 may be cracked, and the cracked protruded portion 150 may be separated from the capping layer 120 as explained referring to FIG. 6E.

Figure 9F:
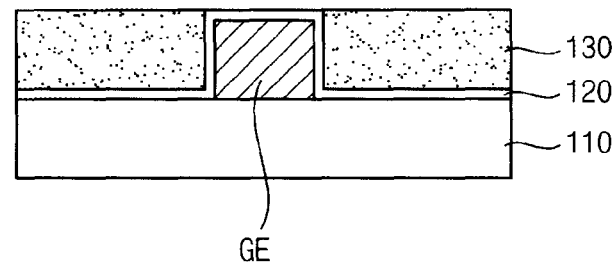

Referring to FIG. 9F, the protruded portion 150 is eliminated so that the substrate, on which the conductive pattern GE is formed, is planarized.

According to the present exemplary embodiment, after the protruded portion 150 is temporally formed on the conductive pattern GE by a back exposure process, the planarizing layer 130 is formed so that the planarizing characteristic of the planarizing layer 130 may be improved.

Figure 10:
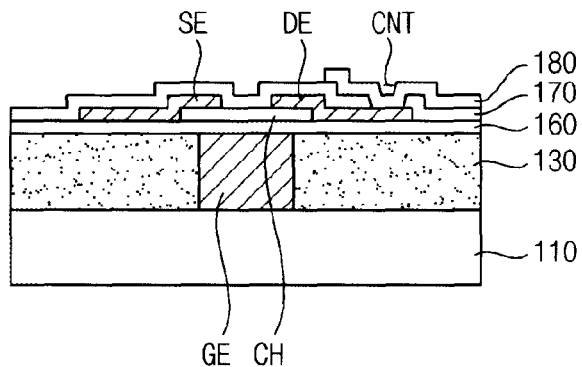
FIG. 10 is a cross-sectional view illustrating a thin film transistor ("TFT") according to still another exemplary embodiment.

FIG. 10 is a cross-sectional view illustrating a thin film transistor ("TFT") according to still another exemplary embodiment. FIGS. 11A to 11J illustrate a method of manufacturing the TFT of FIG. 10.

The TFT of the present exemplary embodiment includes the substrate in FIG. 1 and the method of manufacturing the TFT includes the method of planarizing the substrate explained referring to FIGS. 2A to 2E. Thus, the same reference numerals will be used to refer to the same or like parts as those described in FIGS. 1 and 2A to 2E and any repetitive explanation concerning the above elements will be omitted.

Referring to FIG. 10, the TFT is electrically connected to the gate line and the data line. The TFT may be disposed in an area where the gate line and the data line cross with each other.

The TFT includes a gate electrode GE, a source electrode SE, a drain electrode DE and a semiconductor layer CH. The gate electrode GE may be electrically connected to the gate line.

For example, the gate electrode GE may be formed integratedly with the gate line. The gate electrode GE may be a protruded portion from the gate line.

The gate electrode GE may have a relatively thick thickness. For example, a thickness of the gate electrode GE may be equal to or greater than about 1 μm. For example, a thickness of the gate electrode GE may be between about 1 μm and about 3 μm.

The gate electrode GE has a relatively thick thickness so that a resistance of the gate electrode GE may decrease. Thus, a display panel may be driven at a relatively high speed. In addition, the gate electrode GE has a relatively thick thickness so that the area of the gate electrode GE may be decreased. Thus, an aperture ratio of the display panel may be improved.

The gate electrode GE may include, for example, one of aluminum (Al), copper (Cu), molybdenum (Mo) and titanium (Ti) or an alloy thereof. For example, the gate electrode GE may include a transparent conductive material such as an indium tin oxide (ITO), an indium zinc oxide (IZO) and an aluminum doped zinc oxide (AZO), which transmits a visible ray. The gate electrode GE selectively or totally blocks light from a second surface of the base substrate 110 opposite to a first surface of the base substrate on which the gate electrode GE is formed in a back exposure process. The present invention is not limited to a material of the gate electrode GE.

The semiconductor layer CH overlaps the gate electrode GE. The semiconductor layer CH functions as a channel layer of the TFT.

The semiconductor layer CH may include an amorphous silicon semiconductor. The semiconductor layer CH may include an active layer and an ohmic contact layer. The active layer may include an amorphous silicon. The ohmic contact layer may include an amorphous silicon doped with a dopant.

The semiconductor layer CH may include an oxide semiconductor. For example, the semiconductor layer CH may include at least one of a zinc oxide, a tin oxide, a gallium indium zinc (Ga—In—Zn) oxide, an indium zinc (In—Zn) oxide, a indium tin (In—Sn) oxide, indium tin zinc (In—Sn—Zn) oxide and so on. The semiconductor layer CH may include an oxide semiconductor doped with a metal such as, for example, aluminum (Al), nickel (Ni), copper (Cu), tantalum (Ta), molybdenum (Mo), hafnium (Hf), titanium (Ti), niobium (Nb), chromium Cr, tungsten (W). The present invention is not limited to a material of the oxide semiconductor.

The source electrode SE may be formed integratedly with the data line. The source electrode SE may be a protruded portion from the data line. The source electrode SE overlaps the semiconductor layer CH.

The drain electrode DE overlaps the semiconductor layer CH. The drain electrode DE is spaced apart from the source electrode SE.

The source electrode SE and the drain electrode DE may have a thickness that is thinner than that of the gate electrode GE. Alternatively, the source electrode SE and the drain electrode DE may have a thickness that is substantially same as that of the gate electrode GE.

The source electrode SE and the drain electrode DE may include, for example, one of aluminum (Al), copper (Cu), molybdenum (Mo) and titanium (Ti) or an alloy thereof. For example, the source electrode SE and the drain electrode DE may include a transparent conductive material such as an indium tin oxide (ITO), an indium zinc oxide (IZO) and an aluminum doped zinc oxide (AZO), which transmits a visible ray. The present invention is not limited to a material of the source electrode SE and the drain electrode DE.

A pixel electrode 180 is electrically connected to the drain electrode DE of the TFT. The pixel electrode 180 may be electrically connected to the drain electrode DE through a contact hole CNT. When the TFT is turned on, a data voltage applied to the data line is transmitted to the pixel electrode 180.

Hereinafter, the method of manufacturing the TFT may be explained in detail referring to FIGS. 11A to 11J.

Figure 11A:
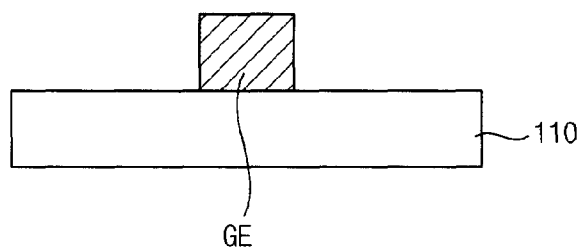
FIGS. 11A to 11J illustrate a method of manufacturing the TFT of FIG. 10.

Referring to FIG. 11A, the gate electrode GE is formed on the first surface of the base substrate 110. The gate electrode GE may be formed by a photoresist process using a first mask. Alternatively, the gate electrode GE may be formed using an organic layer having a first trench corresponding to a shape of the gate electrode GE. The first trench may be formed by a dry etching process in the organic layer.

Figure 11B:
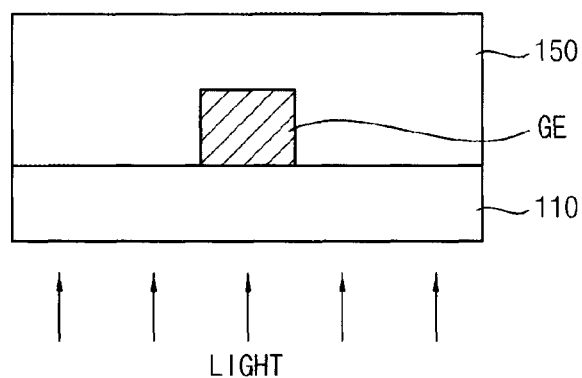

Referring to FIG. 11B, a positive photoresist layer 150 is formed on the base substrate 110 and the gate electrode GE. The second surface of the base substrate 110 opposite to the first surface on which the gate electrode GE is formed is irradiated with light. The positive photoresist layer 150 is exposed to the light entering through the second surface of the base substrate 110.

Figure 11C:
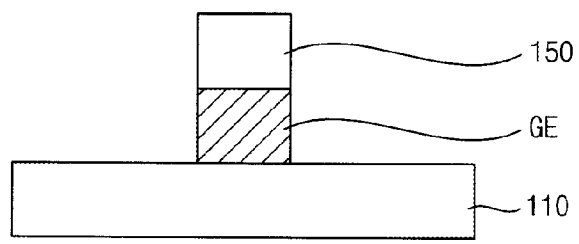

Referring to FIG. 11C, the exposed positive photoresist layer 150 is developed to form a protruded portion 150 on the gate electrode GE.

Figure 11D:
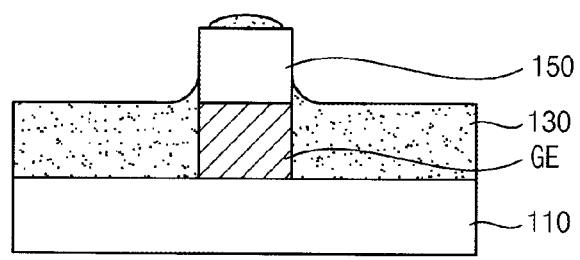

Referring to FIG. 11D, the planarizing layer 130 is formed on the base substrate 110 and the protruded portion 150. The planarizing layer 130 may be coated on the base substrate 110 and the protruded portion 150.

The planarizing layer 130 may be formed using a viscous liquid having a relatively high viscosity. When the planarizing layer 130 is formed, a planarizing material having a relatively high viscosity flows to portions surrounding the gate electrode GE on the base substrate 110.

The protruded portion 150 is formed on the gate electrode GE so that, due to the higher potential energy of the planarizing material laid over the protruded portion 150, the planarizing material flows from the protruded portion 150 toward the base substrate 110. Thus, a planarizing characteristic of the planarizing layer 130 is improved.

The planarizing layer 130 may include a material which does not react with the material used to form the gate electrode GE. Additionally, the material used to form the gate electrode GE does not diffuse into the planarizing layer 130. Thus, the conductive characteristics of the gate electrode GE do not decrease.

According to a characteristic of the planarizing material of the planarizing layer 130, the planarizing layer 130 may cover a portion of an upper surface and a portion of a side surface of the protruded portion 150. When the planarizing layer 130 covers the portion of the upper surface and the portion of the side surface of the protruded portion 150, the protruded portion 150 may be eliminated by using a stripper as explained referring to FIG. 2D, or by the exposing and developing processes as explained referring to FIG. 3D.

Unlike FIG. 11D, according to a characteristic of the planarizing material of the planarizing layer 130, the planarizing layer 130 may completely cover an upper surface and a side surface of the protruded portion 150. When the planarizing layer 130 completely covers the upper surface and the side surface of the protruded portion 150, the protruded portion 150 may be required to be exposed from the planarizing layer 130 to eliminate the protruded portion 150. The protruded portion 150 may be eliminated by using a stripper as explained referring to FIG. 4E, or by the exposing and developing processes as explained referring to FIG. 5E. Alternatively, the protruded portion 150 may be cracked, and the cracked protruded portion 150 may be separated from the gate electrode GE as explained referring to FIG. 6E.

Figure 11E:
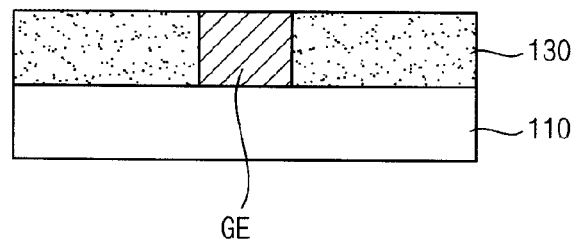

Referring to FIG. 11E, the protruded portion 150 is eliminated so that the substrate, on which the gate electrode GE is formed, is planarized.

Figure 11F:
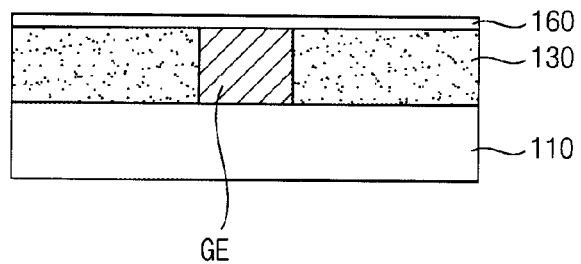

Referring to FIG. 11F, a gate insulating layer 160 is formed on the gate electrode GE and the planarizing layer 130. The gate insulating layer 160 insulates the gate electrode GE from the source electrode SE and the drain electrode DE. The gate insulating layer 160 insulates the gate electrode GE from the semiconductor layer CH.

For example, the gate insulating layer 160 may include a silicon nitride (SiNx). For example, the gate insulating layer 160 may include a silicon oxide (SiOx).

Figure 11G:
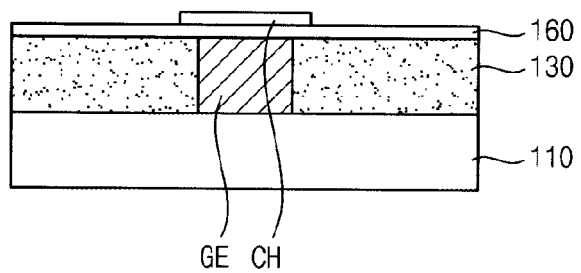

Referring to FIG. 11G, the semiconductor layer CH is formed on the gate insulating layer 160. The semiconductor layer CH overlaps the gate electrode GE. The semiconductor layer CH may be formed by a photoresist process using a second mask.

Figure 11H:
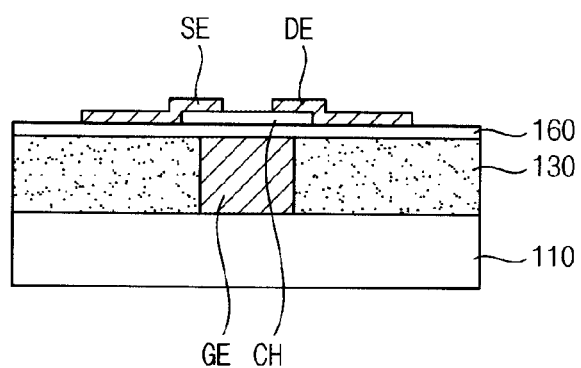

Referring to FIG. 11H, the source electrode SE and the drain electrode DE are formed on the gate insulating layer 160 and the semiconductor layer CH. The source electrode SE and the drain electrode DE overlap the semiconductor layer CH. The source electrode SE and the drain electrode DE may be formed by a photoresist process using a third mask.

Figure 11I:
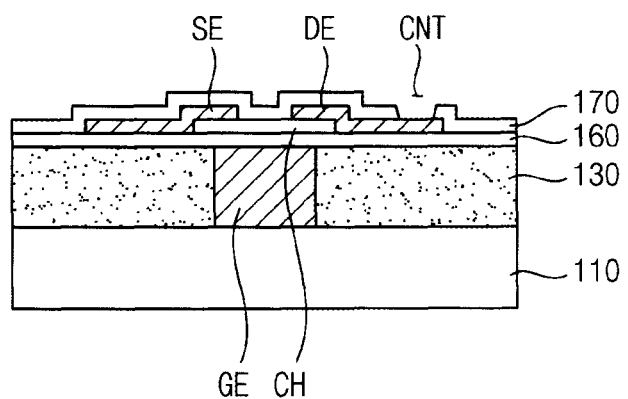

Referring to FIG. 11I, a passivation layer 170 is formed on the source electrode SE, the drain electrode DE and the semiconductor layer CH. Unlike FIG. 11I, the passivation layer 170 may alternatively have a flat upper surface.

The contact hole CNT, through which the drain electrode DE is exposed, is formed in the passivation layer 170. The contact hole CNT may be formed by a photoresist process using a fourth mask.

Figure 11J:
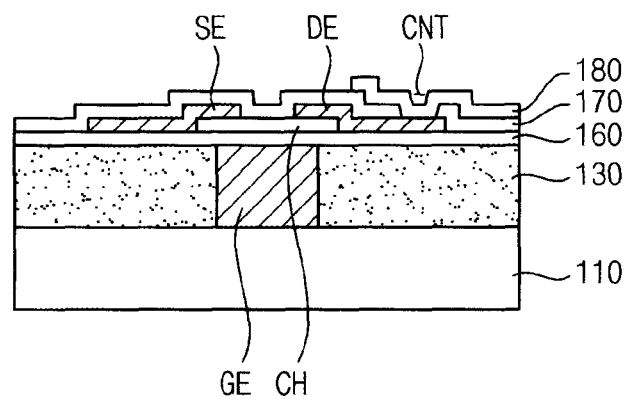

Referring to FIG. 11J, the pixel electrode 180 is formed in a position corresponding to the position of the contact hole CNT. The pixel electrode 180 is connected to the drain electrode DE through the contact hole CNT.

According to the present exemplary embodiment, after the protruded portion 150 is temporally formed on the gate electrode GE by a back exposure process, the planarizing layer 130 is formed so that the planarizing characteristic of the planarizing layer 130 may be improved.

Although not shown in figures, the method of planarizing substrate explained referring to FIGS. 2A to 2E may also be employed to planarize the area over the substrate adjacent to source electrode SE and the drain electrode DE.

Figure 12:
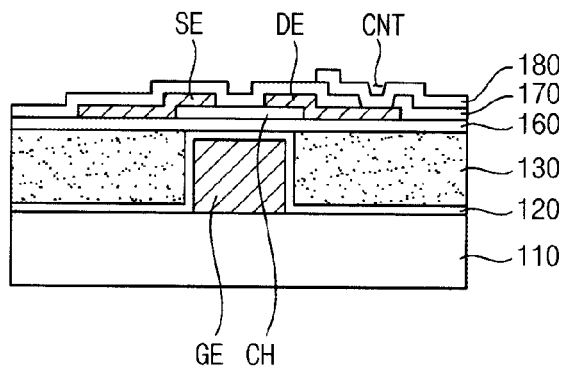
FIG. 12 is a cross-sectional view illustrating a TFT according to still another exemplary embodiment.

FIG. 12 is a cross-sectional view illustrating a TFT according to still another exemplary embodiment. FIGS. 13A to 13K illustrate a method of manufacturing the TFT of FIG. 12.

The TFT of the present exemplary embodiment includes the substrate in FIG. 7 and the method of manufacturing the TFT includes the method of planarizing the substrate explained referring to FIGS. 8A to 8F. Thus, the same reference numerals will be used to refer to the same or like parts as those described in FIGS. 7 and 8A to 8F and any repetitive explanation concerning the above elements will be omitted.

Referring to FIG. 12, the TFT is electrically connected to the gate line and the data line. The TFT may be disposed in an area where the gate line and the data line cross with each other.

The TFT includes a gate electrode GE, a source electrode SE, a drain electrode DE and a semiconductor layer CH. The gate electrode GE may be electrically connected to the gate line.

The gate electrode GE may have a relatively thick thickness. For example, a thickness of the gate electrode GE may be equal to or greater than about 1 μm. For example, a thickness of the gate electrode GE may be between about 1 μm and about 3 μm.

The gate electrode GE has a relatively thick thickness so that a resistance of the gate electrode GE may decrease. Thus, a display panel may be driven at a relatively high speed. In addition, the gate electrode GE has a relatively thick thickness so that the area of the gate electrode GE may be decreased. Thus, an aperture ratio of the display panel may be improved.

The semiconductor layer CH overlaps the gate electrode GE. The semiconductor layer CH functions as a channel layer of the TFT.

The source electrode SE overlaps the semiconductor layer CH. The drain electrode DE overlaps the semiconductor layer CH. The drain electrode DE is spaced apart from the source electrode SE.

A pixel electrode 180 is electrically connected to the drain electrode DE of the TFT. The pixel electrode 180 may be electrically connected to the drain electrode DE through a contact hole CNT. When the TFT is turned on, a data voltage applied to the data line is transmitted to the pixel electrode 180.

Hereinafter, the method of manufacturing the TFT may be explained in detail referring to FIGS. 13A to 13K.

Figure 13A:
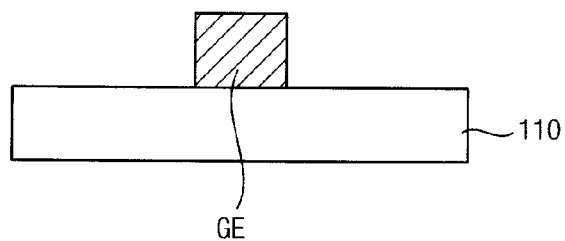
FIGS. 13A to 13K illustrate a method of manufacturing the TFT of FIG. 12.

Referring to FIG. 13A, the gate electrode GE is formed on the first surface of the base substrate 110.

Figure 13B:
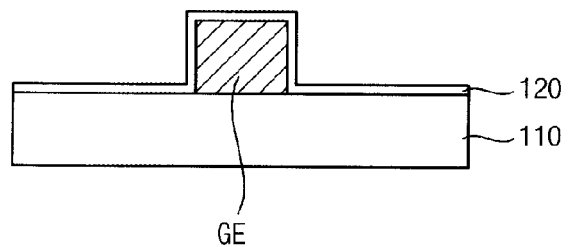

Referring to FIG. 13B, a capping layer 120 is formed on the base substrate 110 and the gate electrode GE.

Figure 13C:
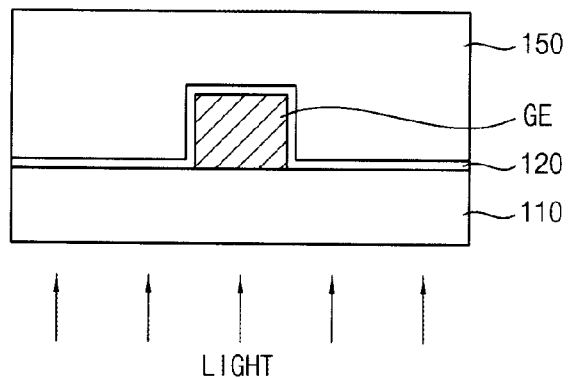

Referring to FIG. 13C, a positive photoresist layer 150 is formed on the capping layer 120. The second surface of the base substrate 110 opposite to the first surface on which the gate electrode GE is formed is irradiated with light. The positive photoresist layer 150 is exposed to the light entering through the second surface of the base substrate 110. The light from the second surface of the base substrate 110 passes through the capping layer 120.

Figure 13D:
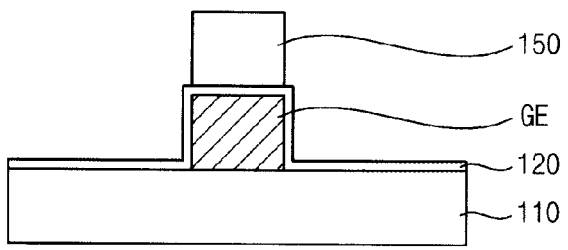

Referring to FIG. 13D, the exposed positive photoresist layer 150 is developed so that a protruded portion 150 is formed on the capping layer 120 overlapping the gate electrode GE.

Figure 13E:
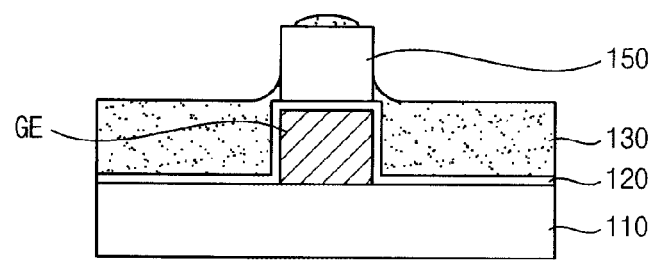

Referring to FIG. 13E, the planarizing layer 130 is formed on the capping layer 120 and the protruded portion 150. The planarizing layer 130 may be coated on the capping layer 120 and the protruded portion 150.

The planarizing layer 130 may be formed using a viscous liquid having a relatively high viscosity. When the planarizing layer 130 is formed, a planarizing material having a relatively high viscosity flows to portions surrounding the gate electrode GE on the capping layer 120.

According to a characteristic of the planarizing material of the planarizing layer 130, the planarizing layer 130 may cover a portion of an upper surface and a portion of a side surface of the protruded portion 150. When the planarizing layer 130 covers the portion of the upper surface and the portion of the side surface of the protruded portion 150, the protruded portion 150 may be eliminated by using a stripper as explained referring to FIG. 2D, or by the exposing and developing processes as explained referring to FIG. 3D.

Unlike FIG. 13E, according to a characteristic of the planarizing material of the planarizing layer 130, the planarizing layer 130 may completely cover an upper surface and a side surface of the protruded portion 150. When the planarizing layer 130 completely covers the upper surface and the side surface of the protruded portion 150, the protruded portion 150 may be required to be exposed from the planarizing layer 130 to eliminate the protruded portion 150. The protruded portion 150 may be eliminated by using a stripper as explained referring to FIG. 4E, or by the exposing and developing processes as explained referring to FIG. 5E. Alternatively, the protruded portion 150 may be cracked, and the cracked protruded portion 150 may be separated from the capping layer 120 as explained referring to FIG. 6E.

Figure 13F:
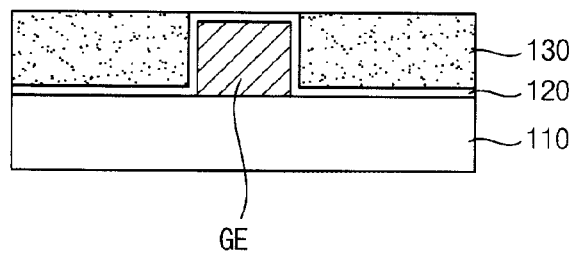

Referring to FIG. 13F, the protruded portion 150 is eliminated so that the substrate, on which the gate electrode GE is formed, is planarized.

Figure 13G:
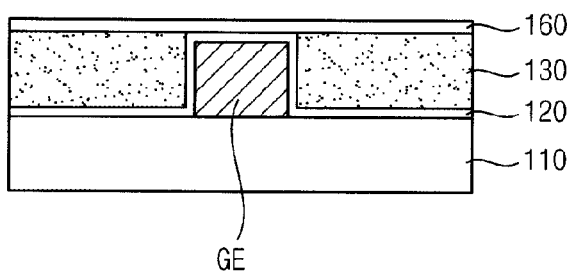

Referring to FIG. 13G, a gate insulating layer 160 is formed on the capping layer 120 and the planarizing layer 130. The gate insulating layer 160 insulates the gate electrode GE from the source electrode SE and the drain electrode DE. The gate insulating layer 160 also insulates the gate electrode GE from the semiconductor layer CH.

For example, the gate insulating layer 160 may include a silicon nitride (SiNx). For example, the gate insulating layer 160 may include a silicon oxide (SiOx).

In the present exemplary embodiment, the gate insulating layer 160 is formed on the capping layer 120 so that the gate electrode GE may be stably insulated from the source electrode SE and the drain electrode DE, and the substrate may be further planarized.

Figure 13H:
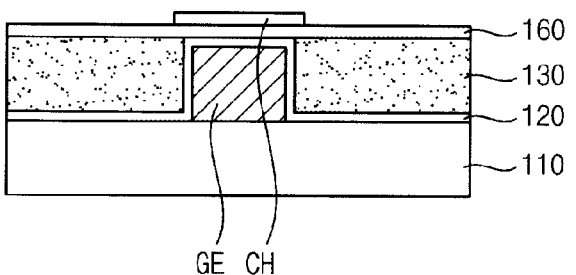

Referring to FIG. 13H, the semiconductor layer CH is formed on the gate insulating layer 160. The semiconductor layer CH overlaps the gate electrode GE. The semiconductor layer CH may be formed by a photoresist process using a second mask.

Figure 13I:
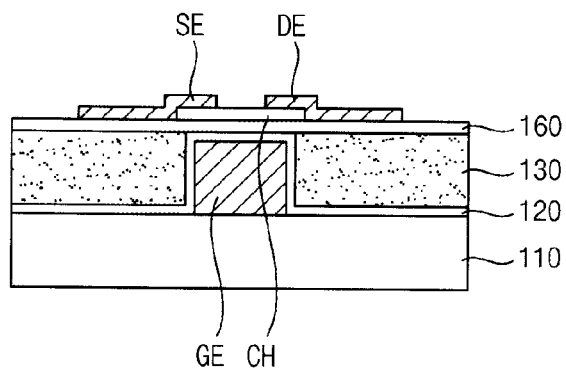

Referring to FIG. 13I, the source electrode SE and the drain electrode DE are formed on the gate insulating layer 160 and the semiconductor layer CH. The source electrode SE and the drain electrode DE overlap the semiconductor layer CH. The source electrode SE and the drain electrode DE may be formed by a photoresist process using a third mask.

Figure 13J:
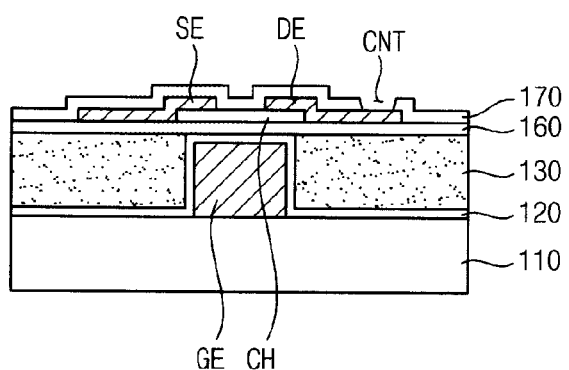

Referring to FIG. 13J, a passivation layer 170 is formed on the source electrode SE, the drain electrode DE and the semiconductor layer CH. Unlike FIG. 13J, the passivation layer 170 may alternatively have a flat upper surface.

The contact hole CNT, through which the drain electrode DE is exposed, is formed in the passivation layer 170. The contact hole CNT may be formed by a photoresist process using a fourth mask.

Figure 13K:
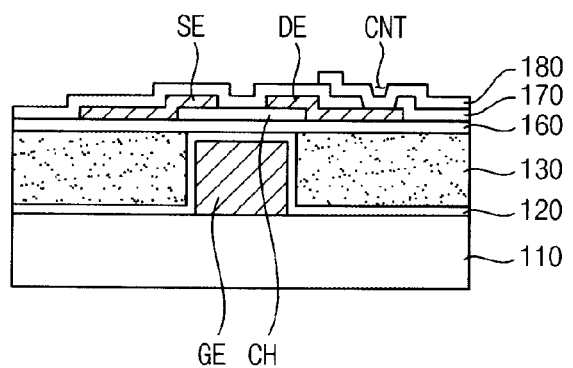

Referring to FIG. 13K, the pixel electrode 180 is formed in a position corresponding to the position of the contact hole CNT. The pixel electrode 180 is connected to the drain electrode DE through the contact hole CNT.

According to the present exemplary embodiment, after the protruded portion 150 is temporally formed on the gate electrode GE by a back exposure process, the planarizing layer 130 is formed so that the planarizing characteristic of the planarizing layer 130 may be improved.

Although not shown in figures, the method of planarizing the substrate explained referring to FIGS. 8A to 8F may also be employed to planarize the area over the substrate adjacent to source electrode SE and the drain electrode DE.

Figure 14:
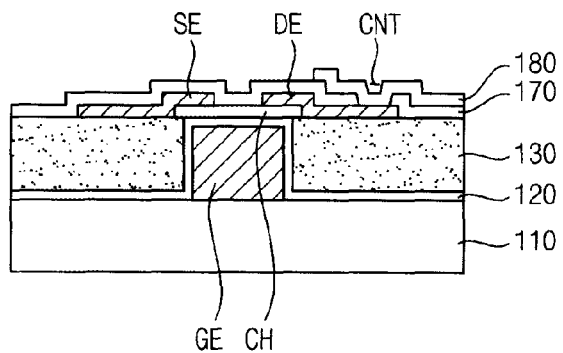
FIG. 14 is a cross-sectional view illustrating a TFT according to still another exemplary embodiment.

FIG. 14 is a cross-sectional view illustrating a TFT according to still another exemplary embodiment. FIGS. 15A to 15J illustrate a method of manufacturing the TFT of FIG. 14.

The TFT of the present exemplary embodiment is substantially the same as the TFT in FIG. 12, except that the TFT does not include the gate insulating layer 160. The method of manufacturing the TFT of the present exemplary embodiment is substantially the same as the method of manufacturing the TFT explained referring to FIGS. 13A to 13K, except that a method of manufacturing the TFT does not include forming the gate insulating layer 160. Thus, the same reference numerals will be used to refer to the same or like parts as those described in FIGS. 12 and 13A to 13K and any repetitive explanation concerning the above elements will be omitted.

Referring to FIG. 14, the TFT is electrically connected to the gate line and the data line. The TFT may be disposed in an area where the gate line and the data line cross with each other.

The TFT includes a gate electrode GE, a source electrode SE, a drain electrode DE and a semiconductor layer CH. The gate electrode GE may be electrically connected to the gate line.

The gate electrode GE may have a relatively thick thickness. For example, a thickness of the gate electrode GE may be equal to or greater than about 1 μm. For example, a thickness of the gate electrode GE may be between about 1 μm and about 3 μm.

The gate electrode GE has a relatively thick thickness so that a resistance of the gate electrode GE may decrease. Thus, a display panel may be driven at a relatively high speed. In addition, the gate electrode GE has a relatively thick thickness so that the area of the gate electrode GE may be decreased. Thus, an aperture ratio of the display panel may be improved.

The semiconductor layer CH overlaps the gate electrode GE. The semiconductor layer CH functions as a channel layer of the TFT.

The source electrode SE overlaps the semiconductor layer CH. The drain electrode DE overlaps the semiconductor layer CH. The drain electrode DE is spaced apart from the source electrode SE.

A pixel electrode 180 is electrically connected to the drain electrode DE of the TFT. The pixel electrode 180 may be electrically connected to the drain electrode DE through a contact hole CNT. When the TFT is turned on, a data voltage applied to the data line is transmitted to the pixel electrode 180.

Hereinafter, the method of manufacturing the TFT may be explained in detail referring to FIGS. 15A to 15J.

Figure 15A:
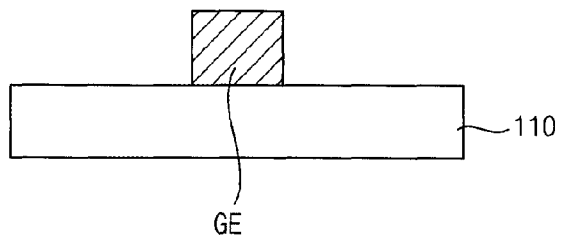
FIGS. 15A to 15J illustrate a method of manufacturing the TFT of FIG. 14.

Referring to FIG. 15A, the gate electrode GE is formed on the first surface of the base substrate 110.

Figure 15B:
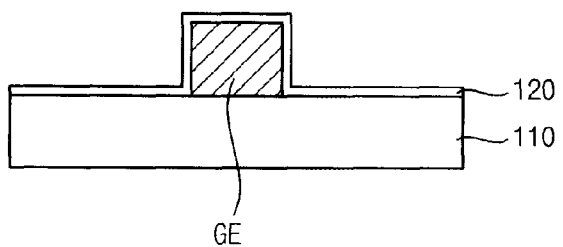

Referring to FIG. 15B, a capping layer 120 is formed on the base substrate 110 and the gate electrode GE.

Figure 15C:
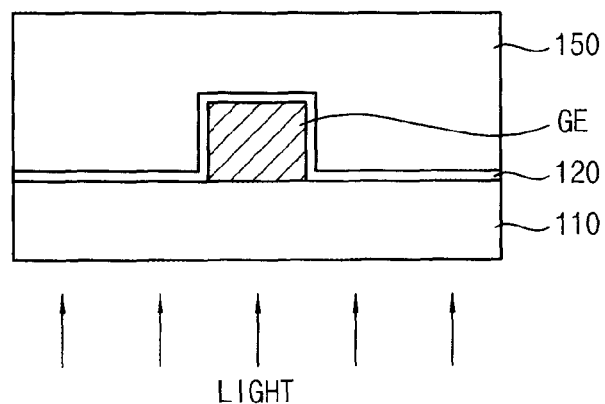

Referring to FIG. 15C, a positive photoresist layer 150 is formed on the capping layer 120. The second surface of the base substrate 110 opposite to the first surface on which the gate electrode GE is formed is irradiated with light. The positive photoresist layer 150 is exposed to the light entering through the second surface of the base substrate 110. The light from the second surface of the base substrate 110 passes through the capping layer 120.

Figure 15D:
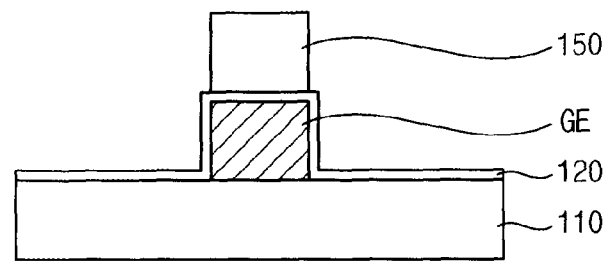

Referring to FIG. 15D, the exposed positive photoresist layer 150 is developed so that a protruded portion 150 is formed on the capping layer 120 overlapping the gate electrode GE.

Figure 15E:
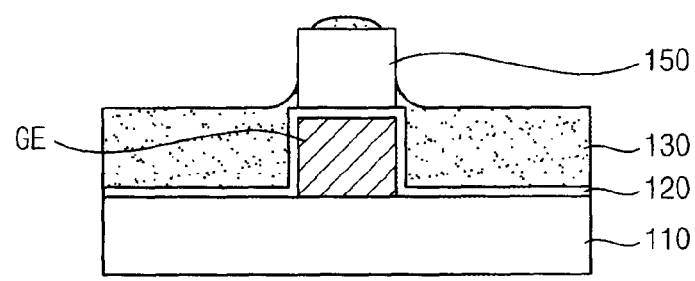

Referring to FIG. 15E, the planarizing layer 130 is formed on the capping layer 120 and the protruded portion 150. The planarizing layer 130 may be coated on the capping layer 120 and the protruded portion 150.

The planarizing layer 130 may be formed using a viscous liquid having a relatively high viscosity. When the planarizing layer 130 is formed, a planarizing material having a relatively high viscosity flows to portions surrounding the gate electrode GE on the capping layer 120.

According to a characteristic of the planarizing material of the planarizing layer 130, the planarizing layer 130 may cover a portion of an upper surface and a portion of a side surface of the protruded portion 150. When the planarizing layer 130 covers the portion of the upper surface and the portion of the side surface of the protruded portion 150, the protruded portion 150 may be eliminated by using a stripper as explained referring to FIG. 2D, or by the exposing and developing processes as explained referring to FIG. 3D.

Unlike FIG. 15E, according to a characteristic of the planarizing material of the planarizing layer 130, the planarizing layer 130 may completely cover an upper surface and a side surface of the protruded portion 150. When the planarizing layer 130 completely covers the upper surface and the side surface of the protruded portion 150, the protruded portion 150 may be required to be exposed from the planarizing layer 130 to eliminate the protruded portion 150. The protruded portion 150 of which a portion is exposed may be eliminated by using a stripper as explained referring to FIG. 4E, or by the exposing and developing processes as explained referring to FIG. 5E. Alternatively, the protruded portion 150 may be cracked, and the cracked protruded portion 150 may be separated from the capping layer 120 as explained referring to FIG. 6E.

Figure 15F:
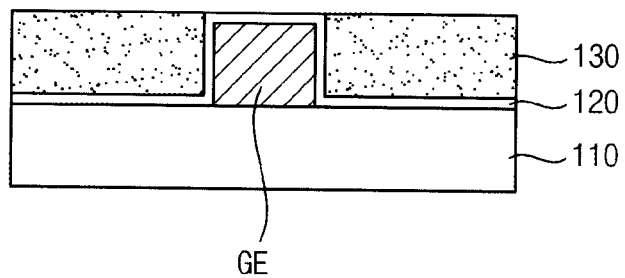

Referring to FIG. 15F, the protruded portion 150 is eliminated so that the substrate, on which the gate electrode GE is formed, is planarized.

The capping layer 120 insulates the gate electrode GE from the source electrode SE and the drain electrode DE. The capping layer 120 insulates the gate electrode GE from the semiconductor layer CH.

For example, the capping layer 120 may include a silicon nitride (SiNx). For example, the capping layer 120 may include a silicon oxide (SiOx).

In the present exemplary embodiment, an additional gate insulating layer is not formed on the capping layer 120 and the gate electrode GE is insulated from the source electrode SE, the drain electrode DE and the semiconductor layer CH so that the processes of manufacturing the TFT may be simplified.

Figure 15G:
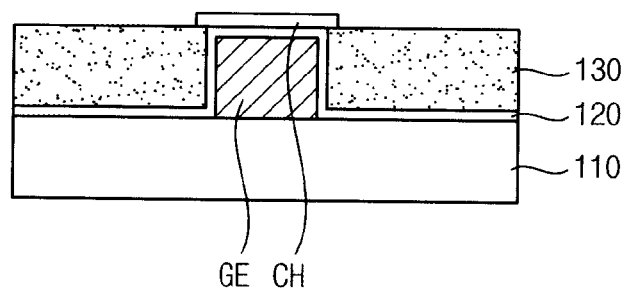

Referring to FIG. 15G, the semiconductor layer CH is formed on the capping layer 120 and the planarizing layer 130. The semiconductor layer CH overlaps the gate electrode GE. The semiconductor layer CH may be formed by a photoresist process using a second mask.

Figure 15H:
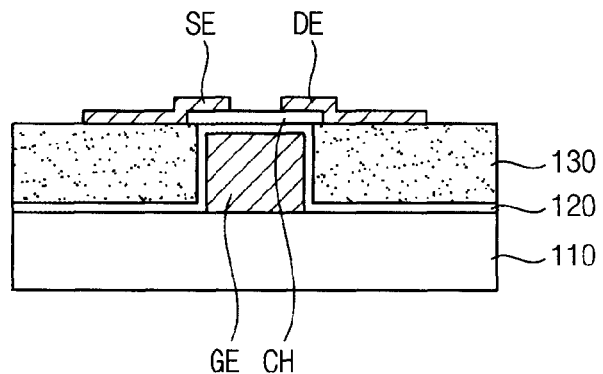

Referring to FIG. 15H, the source electrode SE and the drain electrode DE are formed on the semiconductor layer CH. The source electrode SE and the drain electrode DE overlap the semiconductor layer CH. The source electrode SE and the drain electrode DE may be formed by a photoresist process using a third mask.

Figure 15I:
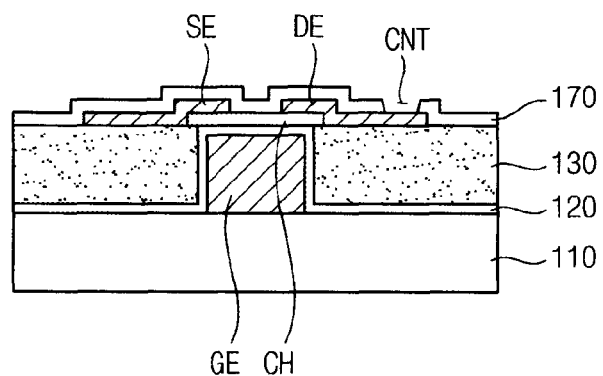

Referring to FIG. 15I, a passivation layer 170 is formed on the source electrode SE, the drain electrode DE and the semiconductor layer CH. Unlike FIG. 15I, the passivation layer 170 may alternatively have a flat upper surface.

The contact hole CNT, through which the drain electrode DE is exposed, is formed in the passivation layer 170. The contact hole CNT may be formed by a photoresist process using a fourth mask.

Figure 15J:
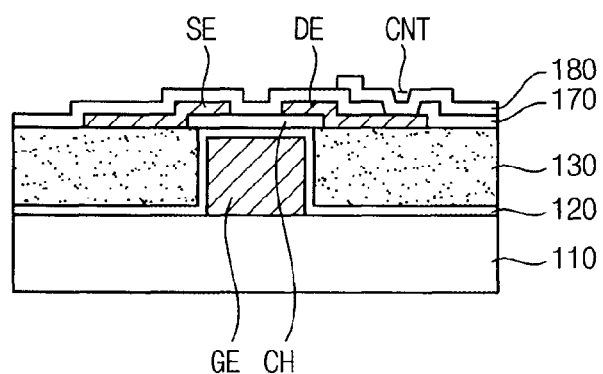

Referring to FIG. 15J, the pixel electrode 180 is formed in a position corresponding to the position of the contact hole CNT. The pixel electrode 180 is connected to the drain electrode DE through the contact hole CNT.

According to the present exemplary embodiment, after the protruded portion 150 is temporally formed on the gate electrode GE by a back exposure process, the planarizing layer 130 is formed so that the planarizing characteristic of the planarizing layer 130 may be improved.

Figure 16:
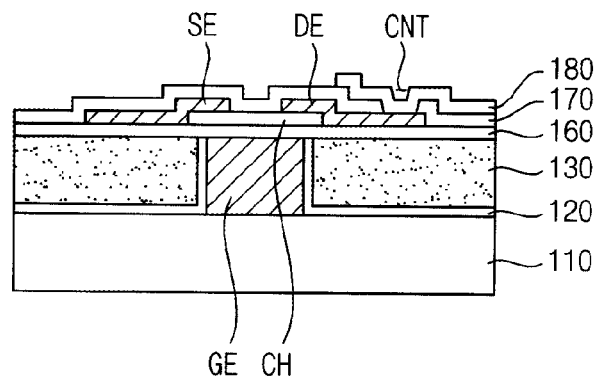
FIG. 16 is a cross-sectional view illustrating a TFT according to still another exemplary embodiment.

FIG. 16 is a cross-sectional view illustrating a TFT according to still another exemplary embodiment of the present invention. FIGS. 17A to 17K illustrate a method of manufacturing the TFT of FIG. 16.

The TFT of the present exemplary embodiment is substantially the same as the TFT in FIG. 12, except that a portion of the capping layer 120 is eliminated. The method of manufacturing the TFT of the present exemplary embodiment is substantially the same as the method of manufacturing the TFT explained referring to FIGS. 13A to 13K, except that a method of manufacturing the TFT further include etching the capping layer 120 and the planarizing layer 130. Thus, the same reference numerals will be used to refer to the same or like parts as those described in FIGS. 12 and 13A to 13K and any repetitive explanation concerning the above elements will be omitted.

Referring to FIG. 16, the TFT is electrically connected to the gate line and the data line. The TFT may be disposed in an area where the gate line and the data line cross with each other.

The TFT includes a gate electrode GE, a source electrode SE, a drain electrode DE and a semiconductor layer CH. The gate electrode GE may be electrically connected to the gate line.

The gate electrode GE may have a relatively thick thickness. For example, a thickness of the gate electrode GE may be equal to or greater than about 1 μm. For example, a thickness of the gate electrode GE may be between about 1 μm and about 3 μm.

The gate electrode GE has a relatively thick thickness so that a resistance of the gate electrode GE may decrease. Thus, a display panel may be driven in a relatively high speed. In addition, the gate electrode GE has a relatively thick thickness so that the area of the gate electrode GE may be decreased. Thus, an aperture ratio of the display panel may be improved.

The semiconductor layer CH overlaps the gate electrode GE. The semiconductor layer CH functions as a channel layer of the TFT.

The source electrode SE overlaps the semiconductor layer CH. The drain electrode DE overlaps the semiconductor layer CH. The drain electrode DE is spaced apart from the source electrode SE.

A pixel electrode 180 is electrically connected to the drain electrode DE of the TFT. The pixel electrode 180 may be electrically connected to the drain electrode DE through a contact hole CNT. When the TFT is turned on, a data voltage applied to the data line is transmitted to the pixel electrode 180.

Hereinafter, the method of manufacturing the TFT may be explained in detail referring to FIGS. 17A to 17K.

Figure 17A:
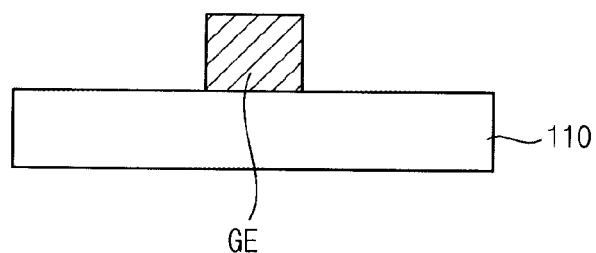
FIGS. 17A to 17K illustrate a method of manufacturing the TFT of FIG. 16.

Referring to FIG. 17A, the gate electrode GE is formed on the first surface of the base substrate 110.

Figure 17B:
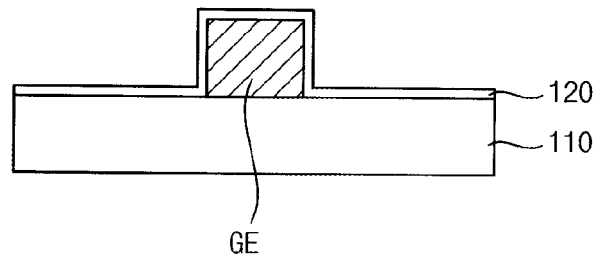

Referring to FIG. 17B, a capping layer 120 is formed on the base substrate 110 and the gate electrode GE.

Figure 17C:
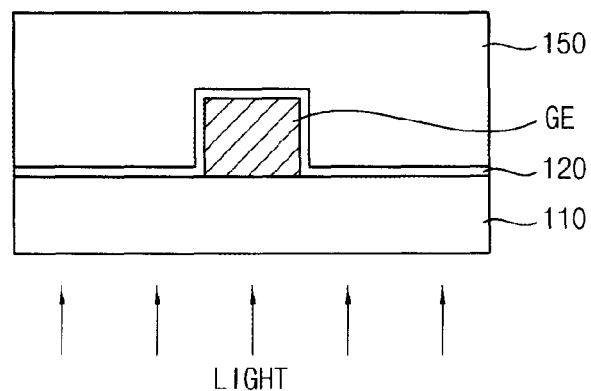

Referring to FIG. 17C, a positive photoresist layer 150 is formed on the capping layer 120. The second surface of the base substrate 110 opposite to the first surface on which the gate electrode GE is formed is irradiated with light. The positive photoresist layer 150 is exposed to the light entering through the second surface of the base substrate 110. The light from the second surface of the base substrate 110 passes through the capping layer 120.

Figure 17D:
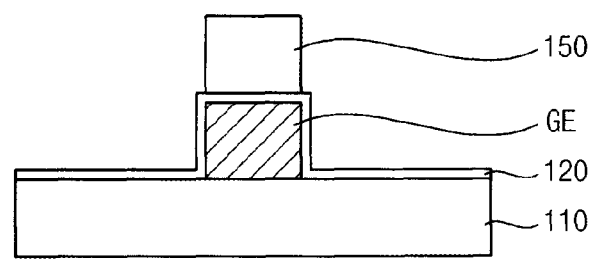

Referring to FIG. 17D, the exposed positive photoresist layer 150 is developed so that a protruded portion 150 is formed on the capping layer 120 overlapping the gate electrode GE.

Figure 17E:
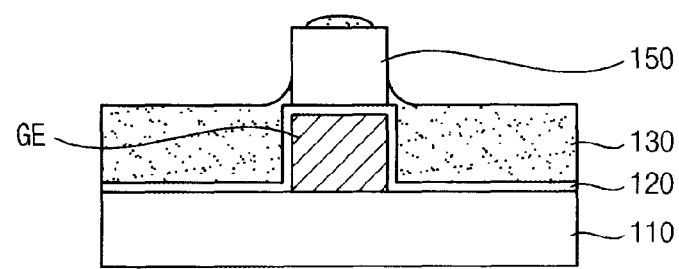

Referring to FIG. 17E, the planarizing layer 130 is formed on the capping layer 120 and the protruded portion 150. The planarizing layer 130 may be coated on the capping layer 120 and the protruded portion 150.

The planarizing layer 130 may be formed using a viscous liquid having a relatively high viscosity. When the planarizing layer 130 is formed, a planarizing material having a relatively high viscosity flows to portions surrounding the gate electrode GE on the capping layer 120.

According to a characteristic of the planarizing material of the planarizing layer 130, the planarizing layer 130 may cover a portion of an upper surface and a portion of a side surface of the protruded portion 150. When the planarizing layer 130 covers the portion of the upper surface and the portion of the side surface of the protruded portion 150, the protruded portion 150 may be eliminated by using a stripper as explained referring to FIG. 2D, or by the exposing and developing processes as explained referring to FIG. 3D.

Unlike FIG. 13E, according to a characteristic of the planarizing material of the planarizing layer 130, the planarizing layer 130 may completely cover an upper surface and a side surface of the protruded portion 150. When the planarizing layer 130 completely covers the upper surface and the side surface of the protruded portion 150, the protruded portion 150 may be required to be exposed from the planarizing layer 130 to eliminate the protruded portion 150. The protruded portion 150 may be eliminated by using a stripper as explained referring to FIG. 4E, or by the exposing and developing processes as explained referring to FIG. 5E. Alternatively, the protruded portion 150 may be cracked, and the cracked protruded portion 150 may be separated be separated from the capping layer 120 as explained referring to FIG. 6E.

Figure 17F:
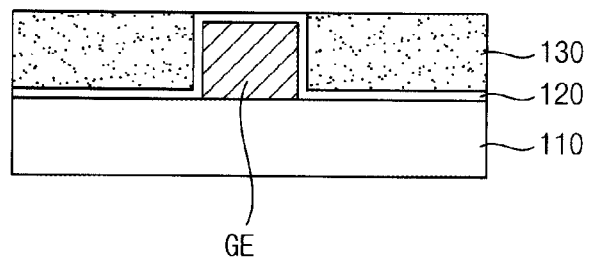

Referring to FIG. 17F, the protruded portion 150 is eliminated so that the substrate, on which the gate electrode GE is formed, is planarized.

Figure 17G:
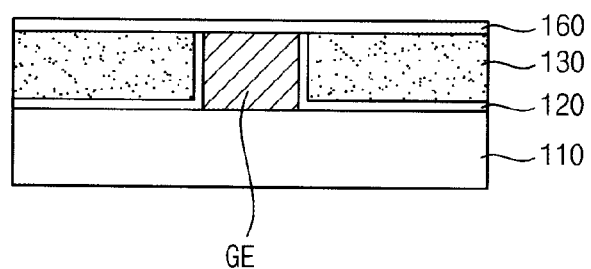

Referring to FIG. 17G, the capping layer 120 and the planarizing layer 130 are etched so that an upper surface of the gate electrode GE is exposed.

A gate insulating layer 160 is formed on the gate electrode GE and the planarizing layer 130. The gate insulating layer 160 insulates the gate electrode GE from the source electrode SE and the drain electrode DE. The gate insulating layer 160 also insulates the gate electrode GE from the semiconductor layer CH.

For example, the gate insulating layer 160 may include a silicon nitride (SiNx). For example, the gate insulating layer 160 may include a silicon oxide (SiOx).

In the present exemplary embodiment, a portion of the capping layer 120 is etched and the gate insulating layer 160 is formed directly on the gate electrode GE so that the gate electrode GE may be stably insulated from the source electrode SE and the drain electrode DE, and the substrate may be further planarized.

Figure 17H:
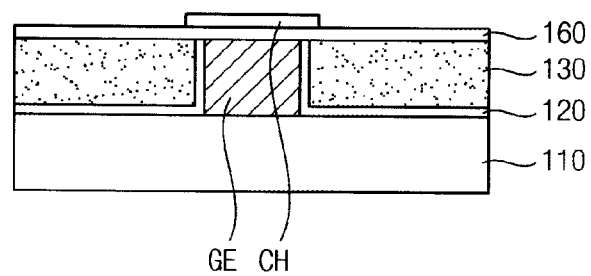

Referring to FIG. 17H, the semiconductor layer CH is formed on the gate insulating layer 160. The semiconductor layer CH overlaps the gate electrode GE. The semiconductor layer CH may be formed by a photoresist process using a second mask.

Figure 17I:
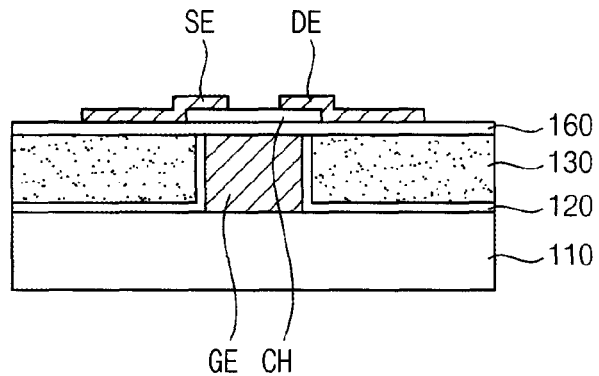

Referring to FIG. 17I, the source electrode SE and the drain electrode DE are formed on the gate insulating layer 160 and the semiconductor layer CH. The source electrode SE and the drain electrode DE overlap the semiconductor layer CH. The source electrode SE and the drain electrode DE may be formed by a photoresist process using a third mask.

Figure 17J:
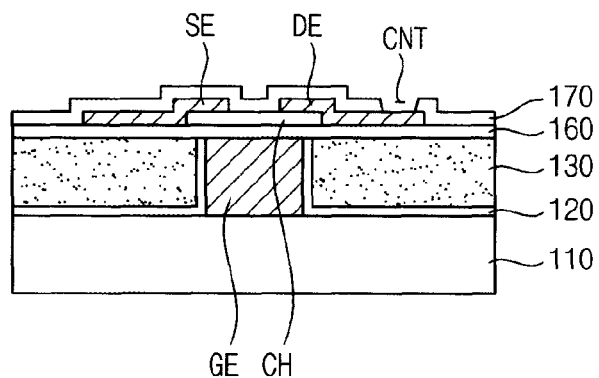

Referring to FIG. 17J, a passivation layer 170 is formed on the source electrode SE, the drain electrode DE and the semiconductor layer CH. Unlike FIG. 13J, the passivation layer 170 may alternatively have a flat upper surface.

The contact hole CNT, through which the drain electrode DE is exposed, is formed in the passivation layer 170. The contact hole CNT may be formed by a photoresist process using a fourth mask.

Figure 17K:
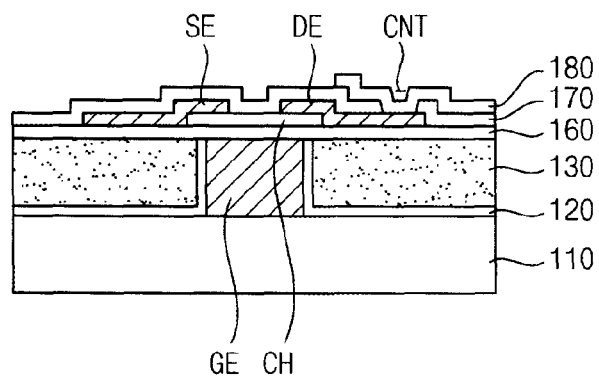

Referring to FIG. 17K, the pixel electrode 180 is formed in a position corresponding to a position of the contact hole CNT. The pixel electrode 180 is connected to the drain electrode DE through the contact hole CNT.

According to the present exemplary embodiment, after the protruded portion 150 is temporally formed on the gate electrode GE by a back exposure process, the planarizing layer 130 is formed so that the planarizing characteristic of the planarizing layer 130 may be improved.

Thus, a reliability of the display apparatus may be improved and the display quality of the display apparatus may be improved.

The foregoing is illustrative and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present disclosure including the claims. In the claims, means-plus-function clauses are intended to cover the structures described herein as performing the recited function and not only structural equivalents but also equivalent structures. It is to be understood that modifications to the example disclosed example embodiments, as well as other example embodiments, are intended to be included within the scope of the disclosure including the appended claims.

What is claimed is:

1. A method of planarizing a substrate, the method comprising:
    forming a conductive pattern on a first surface of a base substrate;
    forming a positive photoresist layer on the base substrate and the conductive pattern;
    exposing the positive photoresist layer to light by irradiating a second surface of the base substrate opposite to the first surface with light;
    developing the positive photoresist layer to form a protruded portion on the conductive pattern;
    forming a planarizing layer on the base substrate and the protruded portion; the protruded portion being protruded with respect to at least a portion of the planarizing layer, and
    eliminating the protruded portion,
    wherein the planarizing layer has a top surface opposite a surface of the planarizing layer facing the base substrate, and the top surface of the planarizing layer is entirely flat after eliminating the protruded portion.

2. The method of claim 1, wherein the planarizing layer is formed using a viscous liquid.

3. The method of claim 1, wherein the planarizing layer does not react with the conductive pattern.

4. The method of claim 1, wherein the protruded portion is eliminated using a stripper that selectively reacts with the protruded portion.

5. The method of claim 4, wherein the eliminating the protruded portion comprises exposing the protruded portion from the planarizing layer covering the protruded portion.

6. The method of claim 5, wherein the exposing the protruded portion comprises ashing the planarizing layer.

7. A method of manufacturing a thin film transistor, the method comprising:
    forming a gate electrode on a first surface of a base substrate;
    forming a positive photoresist layer on the base substrate and the gate electrode;
    exposing the positive photoresist layer to light by irradiating a second surface of the base substrate opposite to the first surface with light;
    developing the positive photoresist layer to form a protruded portion on the gate electrode;
    forming a planarizing layer on the base substrate and the protruded portion;
    eliminating the protruded portion;
    forming a gate insulating layer on the planarizing layer and the gate electrode;
    forming a semiconductor layer overlapping the gate electrode on the gate insulating layer; and
    forming a source electrode and a drain electrode on the semiconductor layer, the source electrode overlapping the semiconductor layer, the drain electrode overlapping the semiconductor layer, the drain electrode being spaced apart from the source electrode,
    wherein the planarizing layer has a top surface opposite a surface of the planarizing layer facing the base substrate, and the top surface of the planarizing layer is entirely flat after eliminating the protruded portion.

8. The method of claim 7, wherein the gate electrode has a thickness between about 1 μm and about 3 μm.

9. The method of claim 7, wherein the planarizing layer is formed using a viscous liquid.

10. The method of claim 7, wherein the planarizing layer does not react with the gate electrode.

11. The method of claim 7, wherein the protruded portion is eliminated using a stripper that selectively reacts with the protruded portion.

* * * * *